(12) United States Patent
Kwon et al.

(10) Patent No.: US 10,290,355 B2
(45) Date of Patent: May 14, 2019

(54) METHOD OF PROGRAMMING SEMICONDUCTOR MEMORY DEVICE

(71) Applicant: SK hynix Inc., Icheon-si, Gyeonggi-do (KR)

(72) Inventors: Eun Mee Kwon, Hwaseong-si (KR); Ji Seon Kim, Seoul (KR); Sang Tae Ahn, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/948,730

(22) Filed: Apr. 9, 2018

(65) Prior Publication Data

US 2018/0226129 A1    Aug. 9, 2018

Related U.S. Application Data

(63) Continuation of application No. 15/457,119, filed on Mar. 13, 2017, now Pat. No. 9,966,144.

(30) Foreign Application Priority Data

Jun. 30, 2016   (KR) .................. 10-2016-0082723

(51) Int. Cl.
*G11C 16/10*  (2006.01)
*G11C 16/04*  (2006.01)
*G11C 16/24*  (2006.01)
*G11C 16/30*  (2006.01)
*G11C 16/34*  (2006.01)

(52) U.S. Cl.
CPC .......... *G11C 16/10* (2013.01); *G11C 16/0483* (2013.01); *G11C 16/24* (2013.01); *G11C 16/30* (2013.01); *G11C 16/3427* (2013.01); *G11C 2207/2227* (2013.01)

(58) Field of Classification Search
CPC ..... G11C 16/10; G11C 16/0483; G11C 16/24; G11C 16/30
USPC ................ 365/185.17, 185.18, 185.19
See application file for complete search history.

(56) References Cited

U.S. PATENT DOCUMENTS

| | | |
|---|---|---|
| 2005/0105359 A1 | 5/2005 | Matsunaga |
| 2009/0067242 A1 | 3/2009 | Jeon et al. |
| 2009/0257280 A1 | 10/2009 | Oh et al. |
| 2011/0103154 A1 | 5/2011 | Cho et al. |
| 2011/0310666 A1* | 12/2011 | Miida .................. G11C 16/10 365/185.11 |

FOREIGN PATENT DOCUMENTS

| | | |
|---|---|---|
| KR | 1020100110615 A | 10/2010 |
| KR | 1020110002243 A | 1/2011 |

* cited by examiner

*Primary Examiner* — Han Yang
(74) *Attorney, Agent, or Firm* — William Park & Associates Ltd.

(57) ABSTRACT

In a method of programming a semiconductor memory device, during a standby period, a standby voltage is applied to word lines coupled to a plurality of memory cells included in a selected memory cell string, and, during a first program period, a first pre-bias voltage is applied to a word line coupled to at least one of programmed memory cells of the selected memory cell string. The first pre-bias voltage is greater than the standby voltage.

19 Claims, 14 Drawing Sheets

METHOD OF PROGRAMMING SEMICONDUCTOR MEMORY DEVICE

CROSS-REFERENCE TO RELATED APPLICATION

The present application claims priority under 35 U.S.C. § 119(a) to Korean patent application number 10-2016-0082723 filed on Jun. 30, 2016, which is incorporated herein by reference in its entirety.

BACKGROUND

1. Technical Field

An aspect of the present disclosure generally relates to a semiconductor memory device, and more particularly to a method of programming a semiconductor memory device capable of preventing a pass disturbance phenomenon.

2. Related Art

Among nonvolatile memory devices, NAND flash memory devices are widely used in applications requiring high-capacity data storage because of their high-density architecture. A memory cell array of a NAND flash memory device includes a plurality of memory cell string structures. Each memory cell string structure may include a source select transistor, a drain select transistor, and a plurality of memory cells coupled in series between the source select transistor and the drain select transistor. The drain select transistor selectively couples a memory cell string to a bit line. Also, the source select transistor selectively couples the string to a common source line coupled to a ground voltage terminal. Here, memory cells of the memory cell string structures arranged in parallel to each other are electrically coupled in common to a word line. In addition, source select transistors of the memory cell string structures arranged in parallel are coupled to a source select line, and drain select transistors of the string structures arranged in parallel are coupled to a drain select line. Accordingly, a plurality of word lines are arranged between the source select line and the drain select line. A program of the NAND flash memory device is performed by applying a program voltage to selected word lines. For example, the program voltage may be applied to sequentially selected word lines from a word line adjacent to the source select line to a word line adjacent to the drain select line.

When the program voltage is applied to the word line to which many memory cells of adjacent memory cell string structures are coupled in common, whether or not the program voltage can move threshold voltages of the memory cells in a positive direction may be determined depending on whether the memory cells are memory cells to be programmed (hereinafter, referred to as "program target cells") or memory cells not to be programmed (hereinafter, referred to as "program inhibition cells"). Here, the program inhibition cells may be divided into program-completed memory cells (hereinafter, referred to as "programmed memory cells") and memory cells in an erase state (hereinafter, referred to as "erase-state memory cells"). Thus, when a voltage is applied to the selected word line, the program target cells can be programmed, whereas the program inhibition cells are not programmed by automatically boosting channel potentials of the program inhibition cells to prevent the threshold voltage changes.

More specifically, a voltage of 0V is applied to a source select line to prevent corresponding memory cell string structures from being coupled to a ground voltage terminal. Also, the voltage of 0V is applied to a bit line coupled to the memory cell string structure including the program target cells, and a power voltage is applied to a bit line coupled to a memory cell string structure including program inhibition cells. In addition, the power voltage is applied to a drain select line. Accordingly, a voltage difference corresponding to the difference between the power voltage applied to the bit line and the threshold voltage of a drain select transistor is created across a channel region of the string structure including the program inhibition cells. In this situation, a program voltage is applied to the selected word line, and a pass voltage is applied to unselected word lines. As a result, the drains select transistor is in an off-state as a channel boosting phenomenon occurs in the channel region of the memory cell string structure including the program inhibition cells, and thus FN tunneling does not occur in the program inhibition cells, and the threshold voltage of the program inhibition cells is not increased.

In order to prevent the threshold voltage of the program inhibition cells from being increased, it is desirable to prevent a program disturbance phenomenon by applying a high-level pass voltage to the program inhibition cells. In addition, it is desirable to prevent a pass disturbance phenomenon. The pass voltage is applied to the word line coupled to the program target cells before the program voltage is applied to the word line. Therefore, there's a possibility that threshold voltages of the program target cells undesirably move by the pass voltage as the pass voltage is increased.

The pass voltage needs to be decided by considering the pass disturbance phenomenon, the program disturbance phenomenon, and a correlation between pass voltages.

SUMMARY

According to an aspect of the present disclosure, a method of programming a semiconductor memory device including a plurality of memory cell strings may include, during a standby period, applying a standby voltage to word lines coupled to a plurality of memory cells included in a selected memory cell string, and during a first program period, applying a first pre-bias voltage to a word line coupled to at least one memory cell among programmed memory cells of the selected memory cell string. The first pre-bias voltage may be greater than the standby voltage.

The method may further include, during the first program period, applying a second pre-bias voltage to a word line coupled to a program target cell of the selected memory cell string. The second pre-bias voltage may be smaller than the standby voltage.

The first pre-bias voltage may have a positive voltage value.

The second pre-bias voltage may have a negative voltage value.

The method may further include, during the first program period, applying the second pre-bias voltage to word lines coupled to erase-state memory cells of the selected memory cell string.

The method may further include, during the first program period, applying the standby voltage to word lines coupled to the other memory cells except the memory cell to which the first pre-bias voltage is applied among the programmed memory cells of the selected memory cell string.

The method may further include, during a second program period, applying a pass voltage or a cutoff voltage to the word lines coupled to the memory cells included in the selected memory cell string, and during a third program period, applying a program voltage to the word line coupled to the program target cell.

During the third program period, the voltage applied to the word lines coupled to the memory cells except the program target cell among the memory cells included in the selected memory cell string may be maintained as the voltage applied during the second program period.

The selected memory cell string may include first to nth memory cells. Here, n is a natural number greater than 1. The program target cell may be an $i^{th}$ memory cell among the first to $n^{th}$ memory cells. Here, i is a natural number that is greater than 1 and smaller than n. During the first program period, the first pre-bias voltage may be applied to word lines coupled to $(i-1-k)^{th}$ to $(i-1)^{th}$ memory cells, and the second pre-bias voltage may be applied to word lines coupled to ith to $(i+1+j)^{th}$ memory cells. Here, k is an integer that is greater than or equal to 0 and smaller than or equal to i-2, and j is an integer that is greater than or equal to 0 and smaller than or equal to n-1-i.

The standby voltage may be a ground voltage.

According to an aspect of the present disclosure, a method for programming a semiconductor memory device including a plurality of memory cell strings may include precharging a channel region of a selected memory cell string, applying a pass voltage to word lines coupled to memory cells included in the selected memory cell string, and applying a program voltage to a word line coupled to a program target cell of the selected memory cell string. In applying the pass voltage to the word lines coupled to the memory cells included in the selected memory cell string, a first pass voltage is applied to word lines coupled to the program target cell and a first memory cell group located adjacent to the program target cell, a first cutoff voltage is applied to word lines coupled to a second memory cell group located adjacent to the first memory cell group, and a second pass voltage is applied to word lines coupled to a third memory cell group located adjacent to the second memory cell group.

The selected memory cell string may include first to $n^{th}$ memory cells. Here, n is a natural number greater than 1. The program target cell may be an ith memory cell among the first to $n^{th}$ memory cells. Here, i is a natural number that is greater than one (1) and smaller than n. The first memory cell group may include $(i-1)^{th}$ to $(i+1)^{th}$ memory cells, the second memory cell group may include $(i-2)^{th}$ and $(i+2)^{th}$ memory cells, and the third memory cell group may include $(i-3)^{th}$ and $(i+3)^{th}$ memory cells.

In applying the pass voltage to the word lines coupled to the memory cells included in the selected memory cell string, a second cutoff voltage may be applied to word lines coupled to a fourth memory cell group located adjacent to the third memory cell group, and a third pass voltage may be applied to word lines coupled to a fifth memory cell group located adjacent to the fourth memory cell group.

The third memory cell group may further include $(i-4)^{th}$ and $(i+4)^{th}$ memory cells, the fourth memory cell group may include $(i-5)^{th}$ and $(i+5)^{th}$ memory cells, and the fifth memory cell group may include $(i-6)^{th}$ and $(i+6)^{th}$ memory cells.

The fifth memory cell group may further include first to $(i-7)^{th}$ memory cells and $(i+7)^{th}$ to $n^{th}$ memory cells.

The second pass voltage may be smaller than the first pass voltage.

The second pass voltage may be greater than the first pass voltage.

The third pass voltage may be smaller than the second pass voltage.

Each of the first cutoff voltage and the second cutoff voltage may be a ground voltage.

In applying the program voltage to the word line coupled to the program target cell of the selected memory cell string, the voltage applied to the word lines coupled to the first to $(i-1)^{th}$ memory cells and the $(i+1)^{th}$ to $n^{th}$ memory cells may be maintained at the voltage applied during a period of applying the pass voltage to the word lines coupled to the memory cells included in the selected memory cell string.

The pass voltage applied to the $(i+1)^{th}$ memory cell may be greater than the pass voltage applied to the $(i-1)^{th}$ memory cell, and the pass voltage applied to the $(i+3)^{th}$ memory cell may be greater than the pass voltage applied to the $(i-3)^{th}$ memory cell.

The pass voltage applied to the $(i+4)^{th}$ memory cell may be greater than the pass voltage applied to the $(i-4)^{th}$ memory cell, and the pass voltage applied to the $(i+6)^{th}$ memory cell may be greater than the pass voltage applied to the $(i-6)^{th}$ memory cell.

The pass voltage applied to the $(i+7)^{th}$ to nth memory cells may be greater than the pass voltage applied to the first to $(i-7)^{th}$ memory cells.

DETAILED DESCRIPTION

Figure 1:
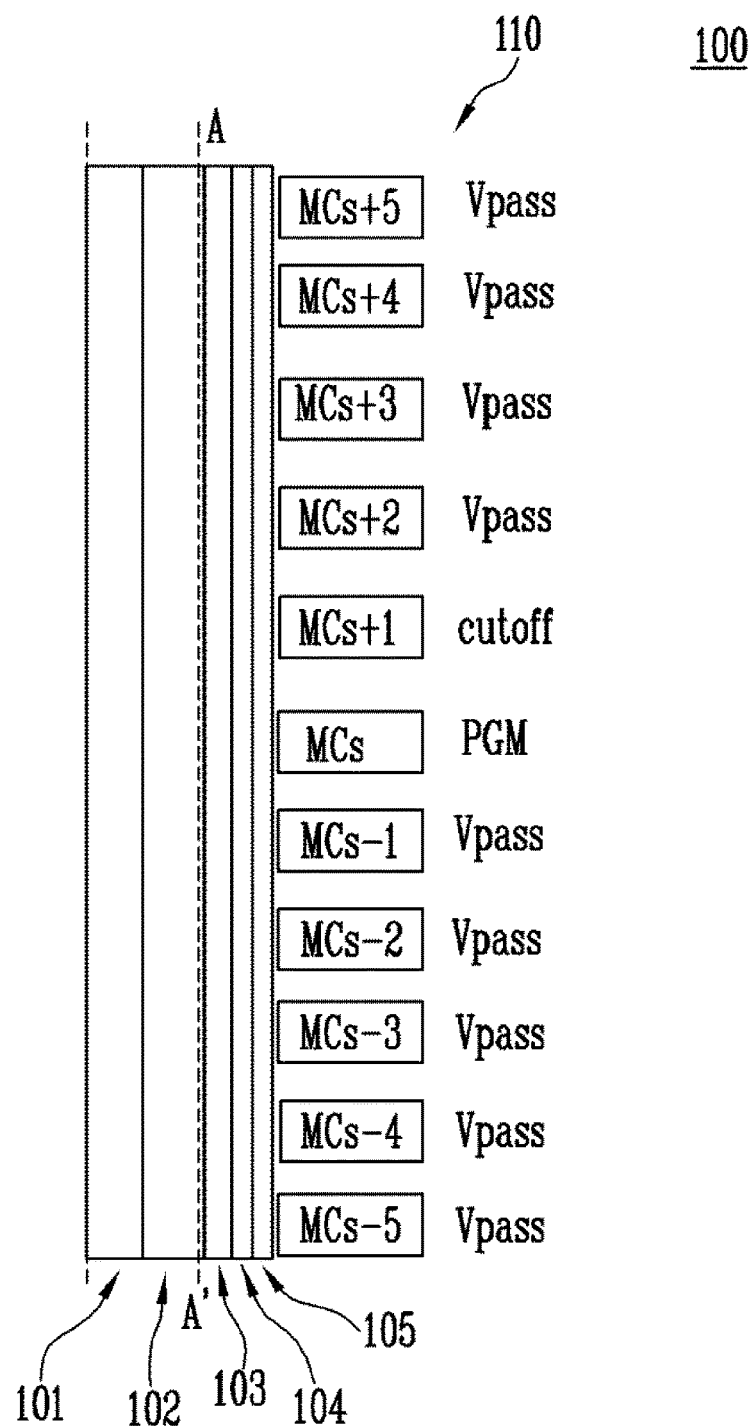
FIG. 1 is a diagram illustrating an example of a memory cell string structure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, exemplary embodiments of the present disclosure will be described in detail with reference to the accompanying drawings. The same reference numerals are used to designate the same elements as those shown in other drawings. In the following descriptions, only portions necessary for understanding operations according to the exemplary embodiments may be described, and descriptions of the other portions may be omitted so as to not obscure important concepts of the embodiments. Therefore, the present disclosure is not limited to the following embodiments but may be implemented in other forms. However, the following embodiments are provided such that those skilled in the art can easily embody the technical concept of the present disclosure.

FIG. 1 is a diagram illustrating a memory cell string structure. In an embodiment, the memory cell string structure may a three-dimensional structure. Referring to FIG. 1, a three-dimensional NAND flash 100 may include a plurality of memory cell strings. An example structure of a memory cell string may include a hole layer 101, a channel layer 102, a tunnel layer 103, a charge trap layer 104, a blocking layer 105, and memory cells MCs−5 to MCs+5 formed around the layers. In a program operation, a program voltage PGM may be applied to a selected memory cell MCs, and a cutoff voltage may be applied to an adjacent memory cell MCs+1. A pass voltage Vpass may be applied to the other memory cells MCs−5 to MCs−1 and MCs+2 to MCs+5. Although only eleven memory cells MCs−5 to MCs+5 are illustrated in FIG. 1, the memory cell string may include more memory cells. For example, the memory cell string may include sixteen memory cells, or the memory cell string may include thirty two memory cells.

Figure 2:
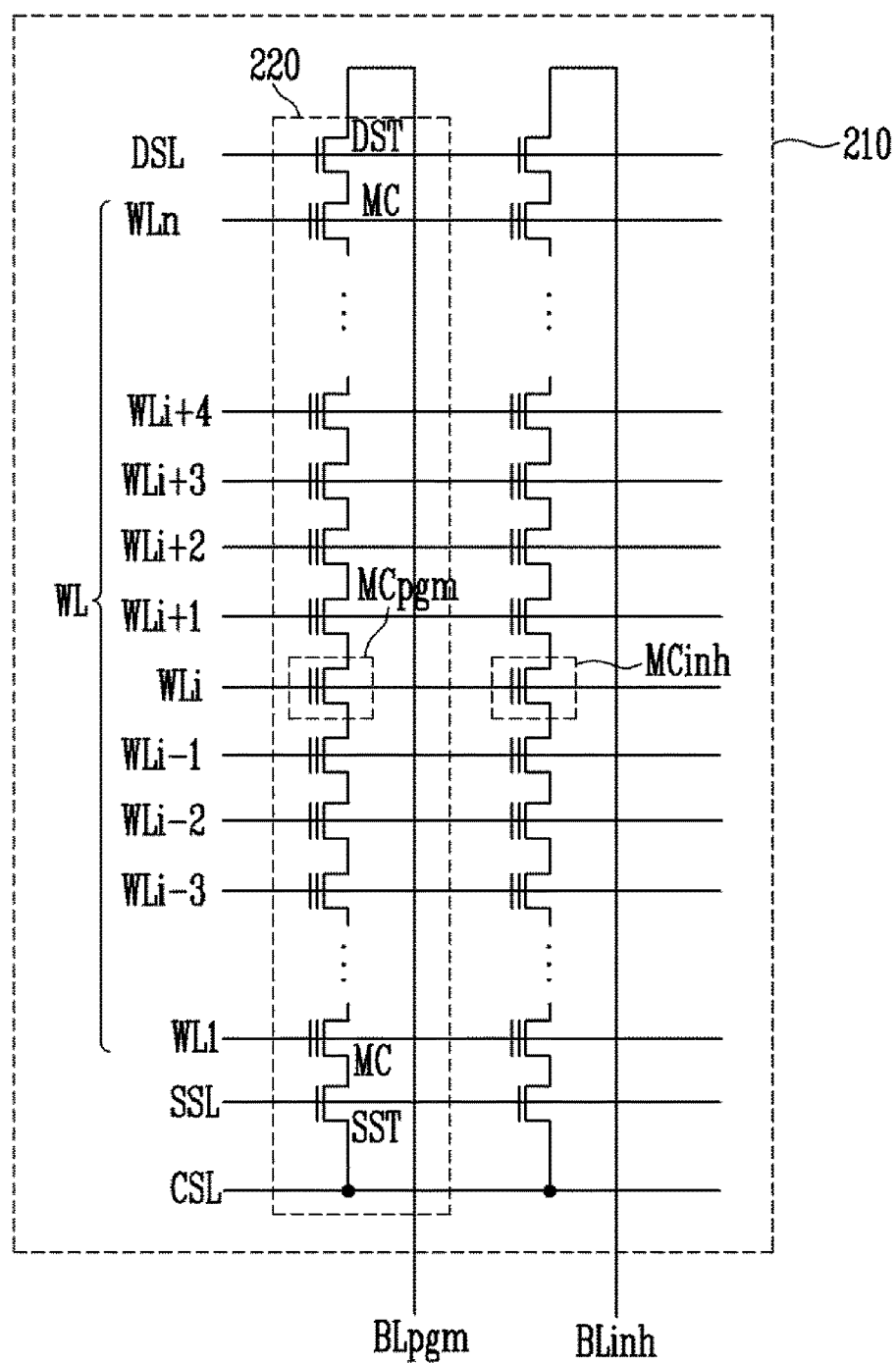
FIG. 2 is a diagram illustrating a plurality of memory cell strings included in a memory cell array.

FIG. 2 is a diagram illustrating a plurality of memory cell strings included in a memory cell array. Referring to FIG. 2, a memory cell array 210 included in a semiconductor memory device includes a plurality of memory cell string structures 220. Each of the memory cell string structures 220 includes a plurality of memory cells MC coupled in series between a source select transistor SST and a drain select transistor DST. The memory cells MC that belong to different string structures 220 but are arranged side by side may be coupled to each other through word lines WL. FIG. 2 illustrates an example structure of a memory cell string that includes n memory cells MC. The word lines may include first to $n^{th}$ word lines WL1 to WLn. Here, the memory cell MC may be implemented in a TFT structure, and therefore may be referred to as a memory cell transistor.

The source select transistors SST of different memory cell string structures 220 arranged side by side are coupled in common to a source select line SSL. The drain select transistors DST of the memory cell string structures 220 arranged side by side are coupled in common to a drain select line DSL.

The drain select transistor DST selectively couples the memory cell string structure 220 to a bit line BL. Also, the source select transistor SST selectively couples the memory cell string structure 220 to a common source line CSL coupled to a ground. In addition, a memory block may include the plurality of memory cell string structures 220 respectively coupled to bit lines BL and coupled in parallel to the common source line CSL. That is, the memory cell string structure 220 shown in FIG. 2 may be implemented as the memory cell string 110 shown in FIG. 1.

In a general program operation, the bit line BL is set up at an early stage of the program operation. In a setup operation of the bit line BL, a power voltage or a ground voltage may be applied to the bit line BL. More specifically, the ground voltage may be applied to a bit line BLpgm in a program mode, which is coupled to a program target cell MCpgm. On the other hand, the power voltage is applied to a bit line BLinh in a program inhibition mode, which is coupled to a program inhibition cell MCinh. Meanwhile, the ground voltage is applied to the source select line SSL, so that the memory cell string structure 220 is blocked from being coupled to a ground voltage terminal. The power voltage Vcc is applied to the drain select line DSL. Accordingly, a channel region of the memory cell string structure 220 including the program inhibition cell MCinh is precharged with a voltage corresponding to the difference between the power voltage applied the bit line BLinh in the program inhibition mode and a threshold voltage of the drain select transistor DST.

If the setup of the bit line BL is completed, a word line voltage is applied to each of the word lines WL. At this time, by decreasing the voltage applied to the drain select line DSL, it is possible to more surely turn off the drain select transistor coupled to the program inhibition cell MCinh. For example, the voltage applied to the drain select line DSL may be maintained at a level that is higher than the ground voltage and lower than the power voltage Vcc.

The program operation may be performed on a page basis, and, according to an embodiment, the program operation may be sequentially performed from a memory cell adjacent to the source select transistor. Therefore, a current target memory cell to be programmed is a program target cell MCpgm coupled to an $i^{th}$ word line WLi, and memory cells coupled to the first to $(i-1)^{th}$ word lines WL1 to WLi−1 are memory cells on which the program operation has been completed, i.e., programmed memory cells. That is, data is stored in the memory cells coupled to the first to $(i-1)^{th}$ word lines WL1 to WLi−1, and accordingly, the memory cells have a program state corresponding to the stored data. The program target cell MCpgm is in an erase state (i.e., a state in which any program operation has not yet been performed since the previous erase operation), and the memory cells coupled to the $(i+1)^{th}$ to nth word lines WLi+1 to WLn are also in the erase state. As described above, the memory cells are memory cells in the erase state.

In an embodiment of the present disclosure, at an early stage of the program operation of the semiconductor memory device, a positive pre-bias voltage may be applied to at least one of the memory cells in which data is stored in the memory cell string including the program target cell MCpgm. In other words, the positive pre-bias voltage is applied to a word line coupled to at least one of the memory cells located between the program target cell MCpgm and the source select transistor SST, so that a negative boosting level can be increased. At the early stage of the program operation, the positive pre-bias voltage may be applied to a word line WLi−1 of a memory cell adjacent to the program target cell MCpgm. Alternatively, at the early stage of the program operation, the positive pre-bias voltage may be applied to word lines coupled to one or more memory cells that are adjacent to the program target cell MCpgm and continuously arranged toward the source select transistor SST. Alternatively, at the early stage of the program operation, the positive pre-bias voltage may be applied to all program-completed memory cells. In other words, at the early stage of the program operation, the positive pre-bias voltage may be applied to all word lines WL1 to WLi−1 coupled to the memory cells located between the program target cell MCpgm and the source select transistor SST to suppress a pass disturbance. The programming method utilizing the positive pre-bias voltage will be described later with reference to FIGS. 3A and 3B.

In an embodiment of the present disclosure, at an early stage of the program operation of the semiconductor memory device, a negative pre-bias voltage may be applied to at least one of the memory cells that are in the erase state. In other words, the negative pre-bias voltage is applied to a word line coupled to the program target cell MCpgm or at least one of the memory cells located between the program target cell MCpgm and the drain select transistor DST, so that the negative booting level can be increased. According to an embodiment, at the early stage of the program operation, the negative pre-bias voltage may be applied to the word line WLi of the program target cell MCpgm. Alternatively, at the early stage of the program operation, the negative pre-bias voltage may be applied to word lines coupled to the program target cell MCpgm and one or more memory cells that are adjacent to the program target cell MCpgm and continuously arranged toward the drain select transistor DST. Alternatively, at the early stage of the program operation, the negative pre-bias voltage may be applied to the program target cell MCpgm and all memory cells in the erase state. In other words, at the early stage of the program operation, the negative pre-bias voltage may be applied to all word lines WLi to WLn coupled to the program target cell MCpgm and the memory cells located between the program target cell MCpgm and the drain select transistor DST. In this way, the pass disturbance may be suppressed. The programming method utilizing the negative pre-bias voltage will be described later with reference to FIGS. 4A and 4B.

In an embodiment, the program operation, instead of being performed from a memory cell adjacent to the source select transistor SST, may be performed from a memory cell adjacent to the drain select transistor DST. In this case, the positive pre-bias voltage is applied to a word line coupled to at least one of the memory cells located between the program target cell MCpgm and the drain select transistor DST, so that the negative boosting level can be increased. In an embodiment, at the early stage of the program operation, the positive pre-bias voltage may be applied to a word line WLi+1 coupled to a memory cell adjacent to the program target cell MCpgm. Alternatively, the positive pre-bias voltage may be applied to word lines coupled to one or more memory cells that are adjacent to the program target cell MCpgm and continuously arranged toward the drain select transistor DST. Alternatively, at the early stage of the program operation, the positive pre-bias voltage may be applied to all program-completed memory cells. In other words, at the early stage of the program operation, the positive pre-bias voltage may be applied to all word lines WLi+1 to WLn coupled to the programmed memory cells. In this way, the pass disturbance may be suppressed.

When the program operation, instead of being performed from a memory cell adjacent to the source select transistor SST, is performed from a memory cell adjacent to the drain select transistor DST, at the early stage of the program operation, the negative pre-bias voltage may be applied to at least one of the memory cells in the erase state. In other words, the negative pre-bias voltage is applied to a word line coupled to the program target cell MCpgm or at least one of the memory cells located between the program target cell MCpgm and the source select transistor SST, so that the negative boosting level can be increased. According to an embodiment, at the early stage of the program operation, the negative pre-bias voltage may be applied to the word line WLi of the program target cell MCpgm. Alternatively, at the early stage of the program operation, the negative pre-bias voltage may be applied to word lines coupled to the program target cell MCpgm and one or more memory cells that are adjacent to the program target cell MCpgm and continuously arranged toward the source select transistor SST. Alternatively, at the early stage of the program operation, the negative pre-bias voltage may be applied to the program target cell MCpgm and all memory cells in the erase state. In other words, at the early stage of the program operation, the negative pre-bias voltage may be applied to all word lines WL1 to WLi coupled to the program target cell MCpgm and the memory cells located between the program target cell MCpgm and the source select transistor SST.

As described above, the programming method according to an embodiment of the present disclosure can be applied regardless of whether the program operation is performed from a memory cell adjacent to the source select transistor or whether the program operation is performed from a memory cell adjacent to the drain select transistor.

Figure 3A:
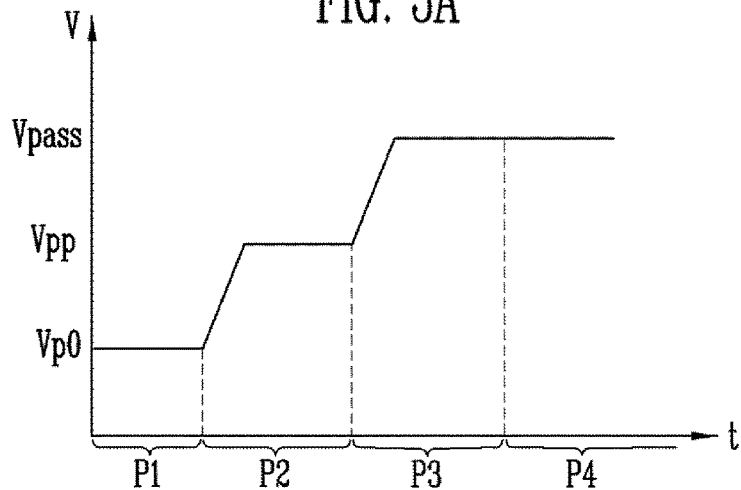
FIG. 3A is a graph illustrating a programming method according to an embodiment of the present disclosure.
Figure 3B:
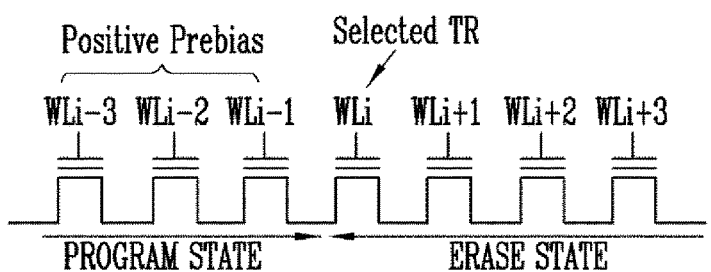
FIG. 3B is a diagram illustrating effects of the programming method according to the embodiment of the present disclosure.
Figure 3B:
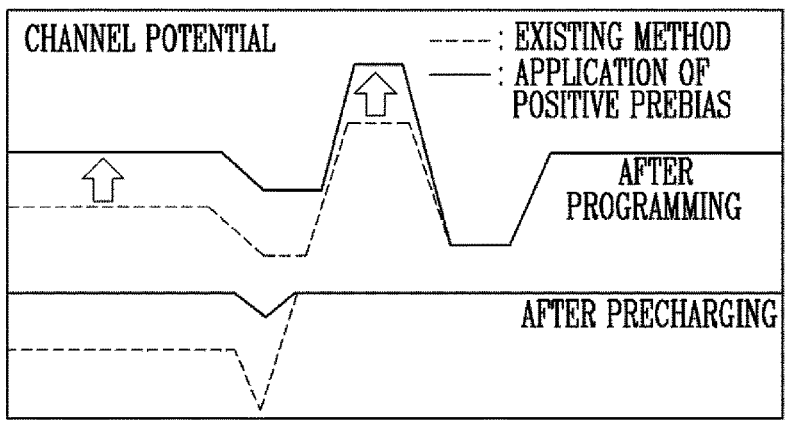
Figure 3B:
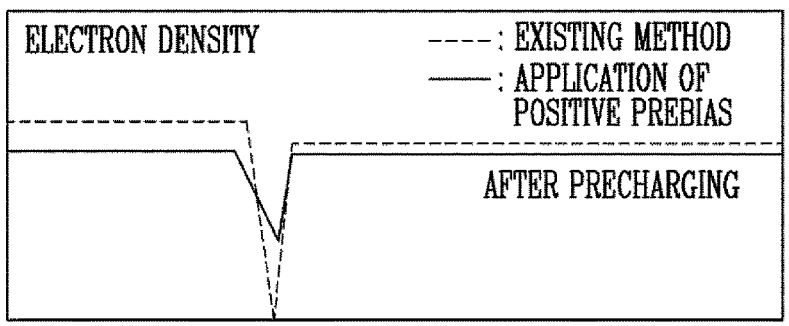

FIG. 3A is a graph illustrating a programming method according to an embodiment of the present disclosure. FIG. 3B is a diagram illustrating effects of the programming method according to the embodiment of the present disclosure. More specifically, FIG. 3A is a timing diagram illustrating voltages applied to word lines coupled to one or more memory cells that are adjacent to the program target cell MCpgm and continuously arranged toward the source select transistor SST at an early stage of a program operation when the memory cell MCpgm of the memory cell string structure 220 shown in FIG. 2 is programmed. For example, the voltages applied to the word lines (e.g., WLi−1−k to WLi−1) coupled to k memory cells continuously arranged toward the source select transistor SST and adjacent to the program cell MCpgm are illustrated in FIG. 3A. Here, "i" may be an integer, and "k" may be an integer that is greater than or equal to zero and smaller than or equal to i−2. A standby period P1 before the program operation is started and a program period P2 to P4 are illustrated in the graph of FIG. 3A. The program period P2 to P4 may be subdivided into a pre-bias application period P2, a pass voltage application period P3, and a program voltage application period P4. Here, the pre-bias application period P2 may be referred to as a first program period, the pass voltage application period P3 may be referred to as a second program period, and the program voltage application period P4 may be referred to as a third program period.

Referring to FIG. 3A, during the standby period P1, a standby voltage Vp0 may be applied to the $(i-1-k)^{th}$ to $(i-1)^{th}$ word lines (e.g., WLi−1−k to WLi−1). During the standby period P1, the standby voltage Vp0 may also be applied to other word lines (e.g., WL1 to WLi−2−k and WLi to WLn). During the pre-bias application period P2, a first pre-bias voltage Vpp greater than the standby voltage Vp0 is applied to the $(i-1-k)^{th}$ to $(i-1)^{th}$ word lines (e.g., WLi−1−k to WLi−1). Also, during the pass voltage application period P3, a pass voltage Vpass is applied to the $(i-1-k)^{th}$ to $(i-1)^{th}$ word lines (e.g., WLi−1−k to WLi−1). During the program voltage application period P4, the pass voltage Vpass may be maintained. This is because the memory cells coupled to the $(i-1-k)^{th}$ to $(i-1)^{th}$ word lines (e.g., WLi−1−k to WLi−1) are not memory cells to be programmed.

In an embodiment, the standby voltage Vp0 may be the ground voltage (e.g., 0 V), and the first pre-bias voltage Vpp may have a positive voltage value.

Referring to FIGS. 3A and 3B, the first pre-bias voltage Vpp having a positive value is applied to the $(i-1-k)^{th}$ to $(i-1)^{th}$ word lines (e.g., WLi−1−k to WLi−1) according to an embodiment shown in FIG. 3A, so that channels are created at the corresponding memory cell transistors. Thus, in FIG. 3B, channel potentials of the programmed memory cells may increase. Accordingly, an electron density in the channels is decreased, thereby increasing the negative boosting level.

Figure 4A:
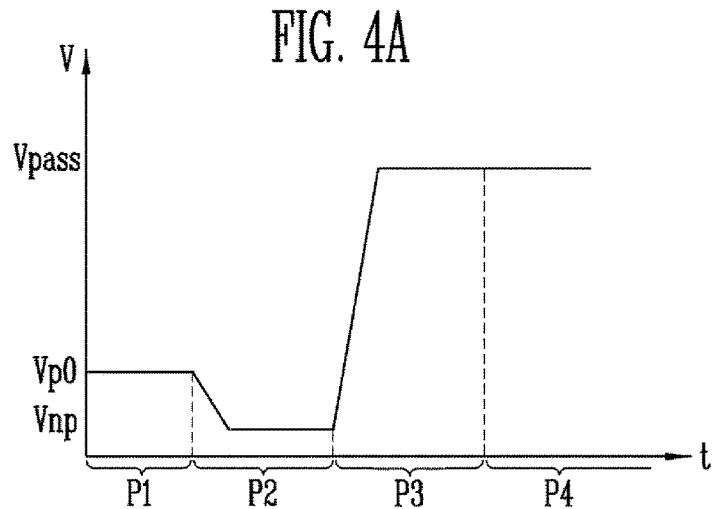
FIG. 4A is a graph illustrating a programming method according to an embodiment of the present disclosure.
Figure 4B:
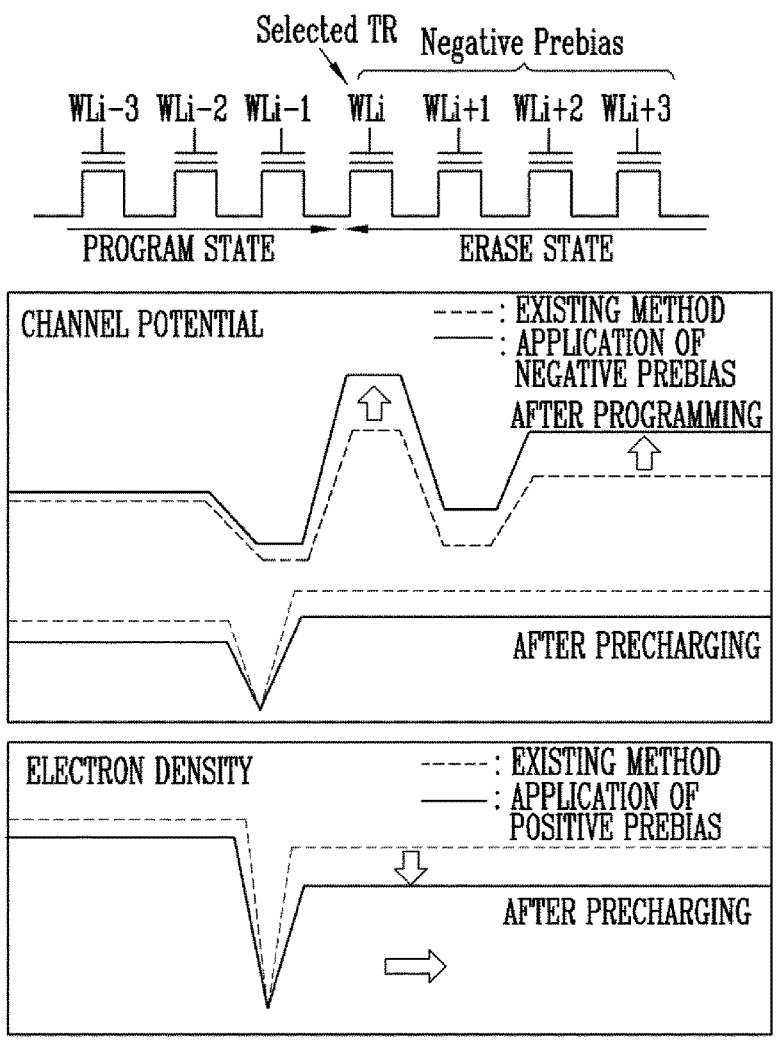
FIG. 4B is a diagram illustrating effects of the programming method according to an embodiment of the present disclosure.

FIG. 4A is a graph illustrating a programming method according to an embodiment of the present disclosure. FIG. 4B is a diagram illustrating effects of the programming method according to the embodiment of the present disclosure. More specifically, FIG. 4A is a timing diagram illustrating voltages applied to word lines coupled to one or more memory cells that are adjacent to the program target cell MCpgm and continuously arranged toward the drain select transistor DST. For example, voltages applied to $(i+1)^{th}$ to $(i+1+j)^{th}$ word lines (e.g., WLi+1 to WLi+1+j) coupled to j memory cells continuously arranged toward the drain select transistor DST and adjacent to the program memory cell MCpgm are illustrated. Here, "i" may be an integer, and "j" may be an integer that is greater than or equal to zero and smaller than or equal to n−1−i. The standby period P1 before the program operation is started and the program period P2 to P4 are illustrated in FIG. 3A. The program period P2 to P4 may be subdivided into the pre-bias application period P2, the pass voltage application period P3, and the program voltage application period P4. Referring to FIG. 4A, during the standby period P1, the standby voltage Vp0 is applied the $(i+1)^{th}$ to $(i+1+j)^{th}$ word lines (e.g., WLi+1 to WLi+1+j). During the pre-bias application period P2, a second pre-bias voltage Vnp smaller than the standby voltage Vp0 is applied to the $(i+1)^{th}$ to $(i+1+j)^{th}$ word lines (e.g., WLi+1 to WLi+1+j). Also, during the pass voltage application period P3, the pass voltage Vpass is applied to the $(i+1)^{th}$ to $(i+1+j)^{th}$ word lines (e.g., WLi+1 to WLi+1+j). During the program voltage application period P4, the pass voltage Vpass is maintained because the memory cells coupled to the $(i+1)^{th}$ to $(i+1+j)^{th}$ word lines WLi+1 to WLi+1+j are not the program target cells.

In an embodiment, the standby voltage Vp0 may be the ground voltage (e.g., 0 V), and the second pre-bias voltage Vnp may have a negative voltage value. In an embodiment, "j" may be n−1−i. In this case, the voltages shown in FIG. 4A may be applied to the $(i+1)^{th}$ to nth word lines (e.g., WLi+1 to WLn). The memory cells coupled to the $(i+1)^{th}$ to $n^{th}$ word lines (e.g., WLi+1 to WLn) are the erase-state memory cells. That is, the second pre-bias voltage Vnp having the negative value is applied to the word lines coupled to the memory cells located between the program target cell MCpgm and the drain select transistor DST.

Referring to FIGS. 4A and 4B, the second pre-bias voltage Vnp having the negative value is applied to the $(i+1)^{th}$ to $n^{th}$ word lines (e.g., WLi+1 to WLn), so that the channel potential can be increased after the program operation is performed on the corresponding memory cells. Accordingly, the electron density in the channels is decreased, thereby increasing the negative boosting level.

Figure 5:
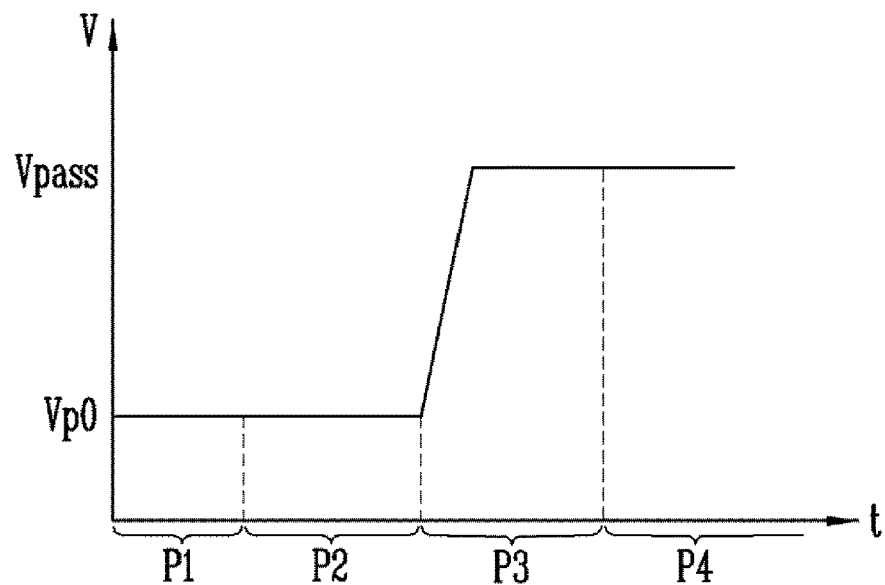
FIG. 5 is a diagram illustrating a programming method according to an embodiment of the present disclosure.

FIG. 5 is a diagram illustrating a programming method according to an embodiment of the present disclosure. More specifically, FIG. 5 is a timing diagram illustrating voltages applied to first to $(i-2-k)^{th}$ word lines (e.g., WL1 to WLi−2−k) and $(i+2+j)^{th}$ to $n^{th}$ word lines (e.g., WLi+2+j to WLn) among the memory cells shown in FIG. 2. In other words, the memory cells to which the voltages of FIG. 5 are applied are the other memory cells except the memory cells receiving the voltages of FIG. 3A, the memory cells receiving the voltages of FIG. 4A, and the program target cell. According to an embodiment, when "k" is i−2 and "j" is n−1−i, there is no memory cell receiving the voltages of FIG. 5. In other cases, the voltages of FIG. 5 are applied to the first to $(i-2-k)^{th}$ word lines (e.g., WL1 to WLi−2−k) and the $(i+2+j)^{th}$ to $n^{th}$ word lines (e.g., WLi+2+j to WLn).

Referring to FIG. 5, during the standby period P1, the standby voltage Vp0 is applied to the first to $(i-2-k)^{th}$ word lines (e.g., WL1 to WLi−2−k) and the $(i+2+j)^{th}$ to $n^{th}$ word lines (e.g., WLi+2+j to WLn). During the pre-bias application period P2, the standby voltage Vp0 is also applied to the word lines WL1 to WLi−2−k and WLi+2+j to WLn. Also, during the pass voltage application period P3, the pass voltage Vpass is applied to the first to $(i-2-k)^{th}$ word lines (e.g., WL1 to WLi−2−k) and the $(i+2+j)^{th}$ to $n^{th}$ word lines (e.g., WLi+2+j to WLn). During the program voltage application period P4, the pass voltage Vpass may be maintained.

Figure 6:
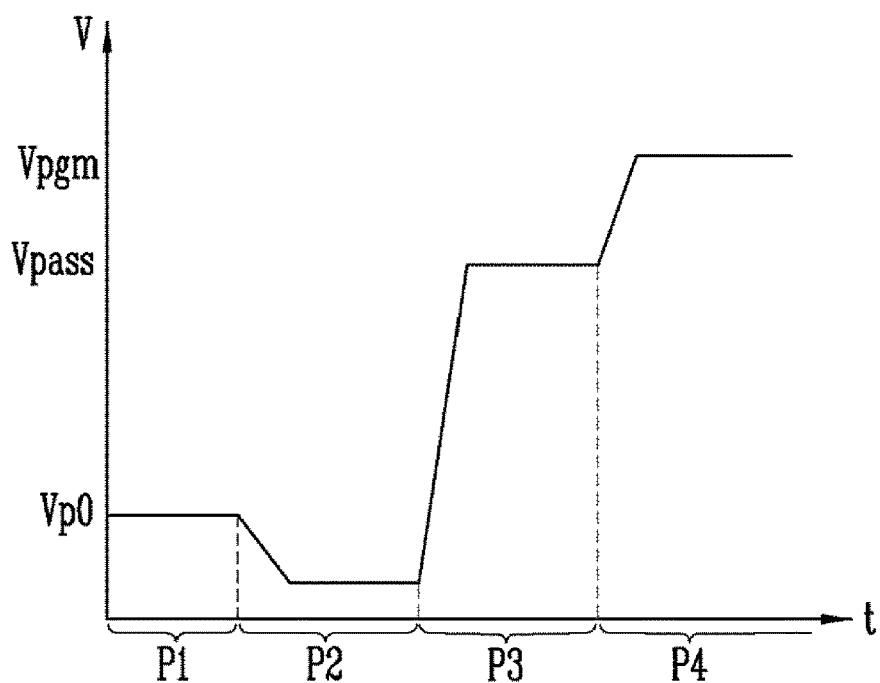
FIG. 6 is a diagram illustrating a programming method according to an embodiment of the present disclosure.

FIG. 6 is a diagram illustrating a programming method according to an embodiment of the present disclosure. More specifically, FIG. 6 is a timing diagram illustrating voltages applied to the word line WLi coupled to the program target cell MCpgm among the memory cells shown in FIG. 2.

Referring to FIG. 6, during the standby period P1, the standby voltage Vp0 is applied to the word line WLi. During the pre-bias application period P2, the second pre-bias voltage Vnp smaller than the standby voltage Vp0 is applied to the word line WLi. Also, during the pass voltage application period P3, the pass voltage Vpass is applied to the word line WLi. During the program voltage application period P4, a program voltage Vpgm is applied to the word line WLi coupled to the program target cell MCpgm.

Referring to FIGS. 3A to 6, the voltages applied to all of the word lines WL1 to WLn during the standby period P1 may be the same as the standby voltage Vp0. During the pre-bias application period P2, the first pre-bias voltage Vpp may be applied to the $(i-1-k)^{th}$ to $(i-1)^{th}$ word lines (e.g., WLi−1−k to WLi−1), the second pre-bias voltage Vnp may be applied to the $i^{th}$ to $(i+1+j)^{th}$ word lines (e.g., WLi to WLi+1+j), and the standby voltage Vp0 may be applied to the first to $(i-2-k)^{th}$ word lines (e.g., WL1 to WLi−2−k) and the $(i+2+j)^{th}$ to $n^{th}$ word lines (e.g., WLi+2+j to WLn). During the pass voltage application period P3, the pass voltage Vpass may be applied to the word lines WL1 to WLn. Also, during the program voltage application period P4, the program voltage Vpgm may be applied to the $i^{th}$ word line WLi, and the pass voltage Vpass may be applied to the other word lines WL1 to WLi−1 and WLi+1 to WLn.

In an embodiment, the pass voltages applied to all of the word lines WL1 to WLn during the pass voltage application period P3 and the program voltage application period P4 may be the same. Alternatively, pass voltages applied to the word lines WL1 to WLn may vary depending on positions of the word lines. Examples of the pass voltage applied to the word lines WL1 to WLn during the pass voltage application period P3 will be described later with reference to FIGS. 7A to 11.

Figure 7A:
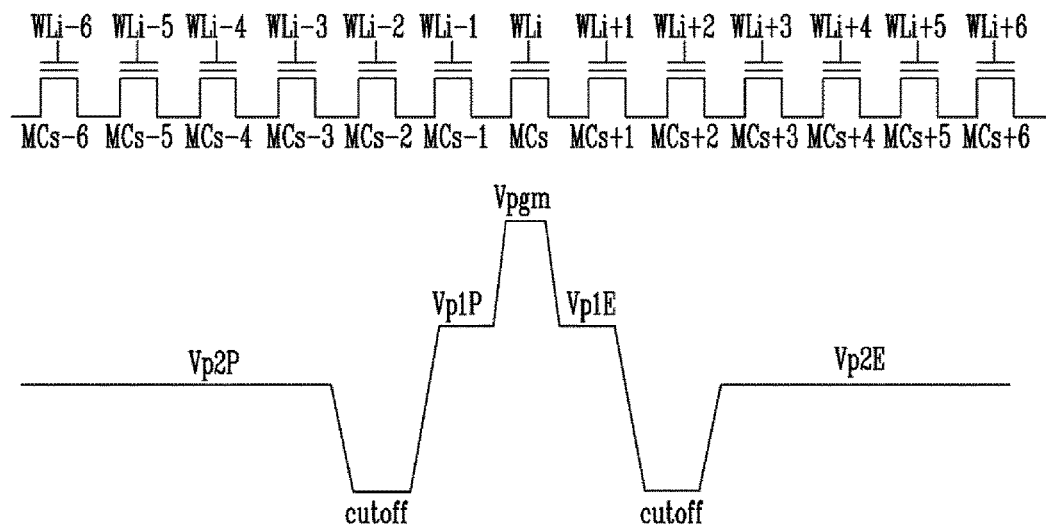
FIG. 7A is a diagram illustrating voltages applied to memory cell transistors during a program voltage application period of a programming method according to an embodiment of the present disclosure.

FIG. 7A is a diagram illustrating voltages applied to memory cell transistors during the program voltage application period of a programming method according to an embodiment of the present disclosure. In FIG. 7A, pass and program voltages applied to word lines WLi−6 to WLi+6 of thirteen memory cells MCs−6 to MCs+6 including a memory cell MCs to be programmed are illustrated.

Referring to FIG. 7A, during the program voltage application period, the program voltage Vpgm is applied, and first pass voltages Vp1P and Vp1E are applied to $(i-1)^{th}$ and $(i+1)^{th}$ word lines WLi−1 and WLi+1, respectively. Also, a cutoff voltage is applied to $(i-2)^{th}$ and $(i+2)^{th}$ word lines WLi−2 and WLi+2. Second pass voltages Vp2P and Vp2E are applied to $(i-6)^{th}$ to $(i-3)^{th}$ word lines WLi−6 to WLi−3 and $(i+3)^{th}$ to $(i+6)^{th}$ word lines WLi+3 to WLi+6, respectively. The cutoff voltage is a voltage that may be used to localize a boosting region that prohibits programming. Therefore, the cutoff voltage may have a voltage level that is smaller than the pass voltage and equal to or greater than the ground voltage. For example, in an embodiment, the cutoff voltage may be the ground voltage. Alternatively, the cutoff voltage may have a voltage level that is greater than that of the ground voltage and smaller than that of the second pass voltages Vp2P and Vp2E.

Although not shown in FIG. 7A, the second pass voltages Vp2P and Vp2E are applied to first to $(i-7)^{th}$ word lines (e.g., WL1 to WLi−7) and $(i+7)^{th}$ to $n^{th}$ word lines (e.g., WLi+7 to WLn), respectively. Here, the first pass voltage Vp1P applied to program-completed memory cells, and the first pass voltage Vp1E applied to erase-state memory cells may have the same value. Also, the second pass voltage Vp2P applied to program-completed memory cells, and the second pass voltage Vp2E applied to erase-state memory cells may have the same value. Also, the first pass voltages Vp1P and Vp1E may have a value greater than that of the second pass voltages Vp2P and Vp2E. The cutoff voltage cutoff is applied to the $(i-2)^{th}$ and $(i+2)^{th}$ word lines WLi−2 and WLi+2, so that a local boosting state can be made. Further, the first pass voltages Vp1P and Vp1E having a relatively high voltage level are applied to prevent a leakage current from the program target cell MCs.

The voltages applied to the memory cell transistors during the program voltage application period are illustrated in FIG. 7A. During the pass voltage application period, voltages applied to the first to $(i-1)^{th}$ word lines WL1 to WLi−1 and the $(i+1)^{th}$ to $n^{th}$ word lines WLi+1 to WLn may be identical to the voltages applied to the word lines of FIG. 7A. During the pass voltage application period, the first pass voltage Vp1p applied to the program-completed memory cells may be applied to the $i^{th}$ word line WLi.

In an embodiment, memory cells included in a memory cell string may be grouped as follows. For example, memory cells MCs−1 to MCs+1 may be grouped as a first memory cell group, memory cells MCs−2 and MCs+2 may be grouped as a second memory cell group, and the other memory cells MCs1 to MCs−3 and MCs+3 to MCn may be grouped as a third memory cell group. In this case, during the pass voltage application period, the first pass voltages Vp1P and Vp1E may be applied to the first memory cell group, the cutoff voltage cutoff may be applied to the second memory cell group, and the second pass voltages Vp2P and Vp2E may be applied to the third memory cell group. In FIG. 7A, the second memory cell group is located adjacent to the first memory cell group, and the third memory cell group is located adjacent to the second memory cell group. The number of memory cells included in each group may be modified when necessary. For example, the number of memory cells belonging to the first memory cell group, the number of memory cells belonging to the second memory cell group, and the number of memory cells belonging to the third memory cell group are 3, 2, and n−5, respectively. However, the numbers may vary.

Figure 7B:
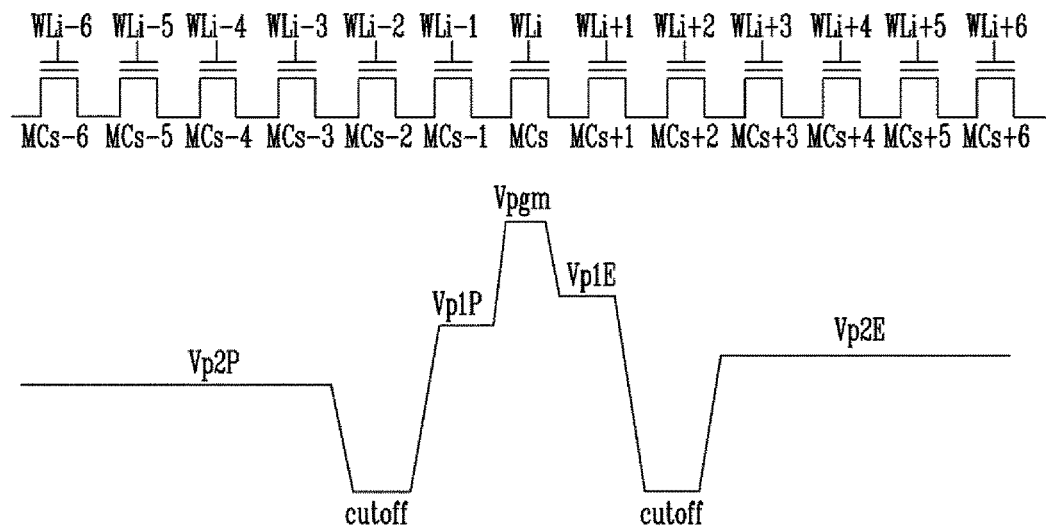
FIG. 7B is a diagram illustrating voltages applied to the memory cell transistors during the program voltage application period of a programming method according to an embodiment of the present disclosure.

FIG. 7B is a diagram illustrating voltages applied to the memory cell transistors during the program voltage application period of a programming method according to an embodiment of the present disclosure. Like FIG. 7A, in FIG. 7B, pass and program voltages applied to the word lines WLi−6 to WLi+6 of the thirteen memory cells MCs−6 to MCs+6 including the memory cell MCs to be programmed are illustrated. FIG. 7B is different from FIG. 7A in that the first pass voltage Vp1E applied to the erase-state memory cells is greater than the first pass voltage Vp1P applied to the program-completed memory cells, and the second pass voltage Vp2E applied to the erase-state memory cells is greater than the second pass voltage Vp2P applied to the program-completed memory cells. According to the above-described embodiment, a program/pass disturbance phenomenon can be prevented.

Figure 8A:
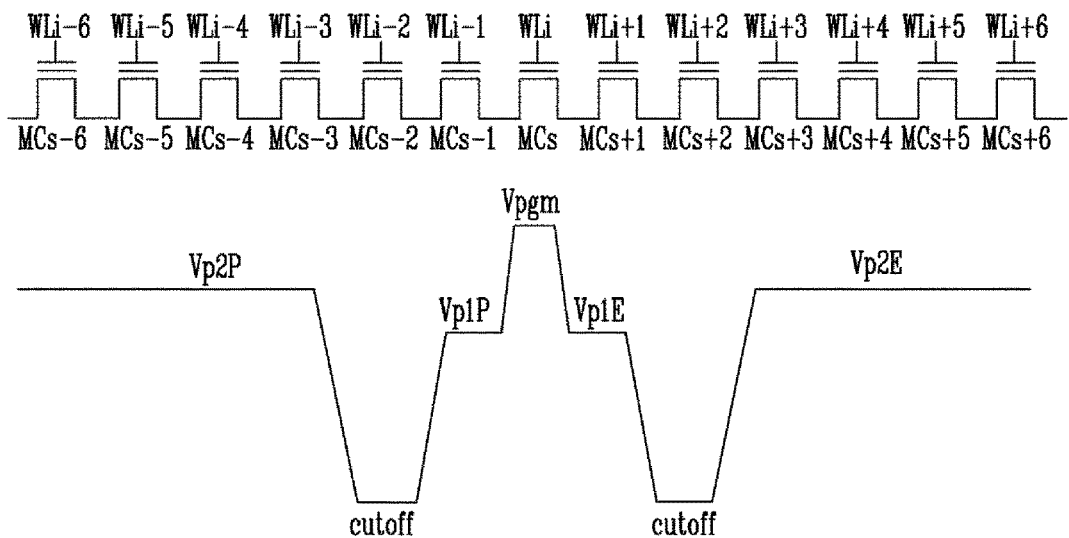
FIG. 8A is a diagram illustrating voltages applied to the memory cell transistors during the program voltage application period of a programming method according to an embodiment of the present disclosure.

FIG. 8A is a diagram illustrating voltages applied to the memory cell transistors during the program voltage application period of a programming method according to an embodiment of the present disclosure. In FIG. 8A, pass and program voltages applied to the word lines WLi−6 to WLi+6 of the thirteen memory cells MCs−6 to MCs+6 including the memory cell MCs to be programmed are illustrated.

Referring to FIG. 8A, during the program voltage application period, the program voltage Vpgm is applied to the $i^{th}$ word line WLi, and the first pass voltages Vp1P and Vp1E are applied to the $(i-1)^{th}$ and $(i+1)^{th}$ word lines WLi−1 and WLi+1, respectively. Also, the cutoff voltage is applied to the $(i-2)^{th}$ and $(i+2)^{th}$ word lines WLi−2 and WLi+2. The second pass voltages Vp2P and Vp2E are applied to the $(i-6)^{th}$ to $(i-3)^{th}$ word lines WLi−6 to WLi−3 and the $(i+3)^{th}$ to $(i+6)^{th}$ word lines WLi+3 to WLi+6, respectively.

FIG. 8A is different from FIG. 7A in that the second pass voltages Vp2P and Vp2E are greater than the first pass voltages Vp1P and Vp2E. The other portions are the same as those of FIG. 7A. In FIG. 8A, the memory cells included in the memory cell string may be grouped as follows. For example, the memory cells MCs−1 to MCs+1 may be grouped as a first memory cell group, the memory cells MCs−2 and MCs+2 may be grouped as a second memory cell group, and the other memory cells MCs1 to MCs−3 and MCs+3 to MCn may be grouped as a third memory cell group. In this case, during the pass voltage application period, the first pass voltages Vp1P and Vp1E may be applied to the first memory cell group, the cutoff voltage may be applied to the second memory cell group, and the second pass voltages Vp2P and Vp2E may be applied to the third memory cell group. The number of memory cells included in each group may be modified when necessary. For example, the number of memory cells belonging to the first memory cell group, the number of memory cells belonging to the second memory cell group, and the number of memory cells belonging to the third memory cell group are 3, 2, and n−5, respectively. However, the numbers may vary.

Figure 8B:
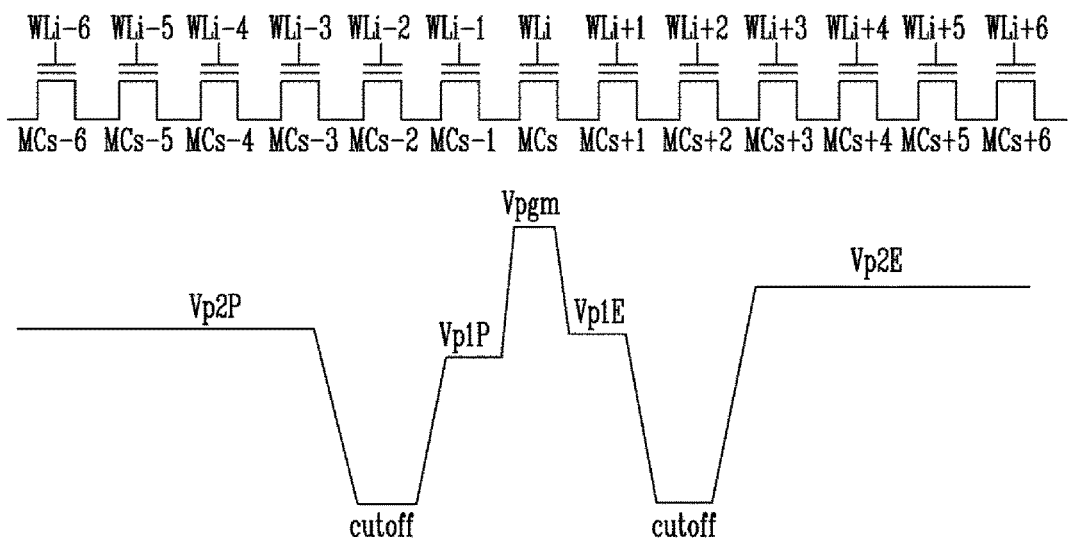
FIG. 8B is a diagram illustrating voltages applied to the memory cell transistors during the program voltage application period of a programming method according to an embodiment of the present disclosure.

FIG. 8B is a diagram illustrating voltages applied to the memory cell transistors during the program voltage application period of a programming method according to an embodiment of the present disclosure. Like FIG. 8A, in FIG. 8B, pass and program voltages applied to the word lines WLi−6 to WLi+6 of the thirteen memory cells MCs−6 to MCs+6 including the memory cell MCs to be programmed are illustrated. FIG. 8B is different from FIG. 8A in that the first pass voltage Vp1E applied to the erase-state memory cells is greater than the first pass voltage Vp1P applied to the program-completed memory cells, and the second pass voltage Vp2E applied to the erase-state memory cells is greater than the second pass voltage Vp2P applied to the program-completed memory cells. According to the above-described embodiment, the program/pass disturbance phenomenon can be prevented.

Figure 9A:
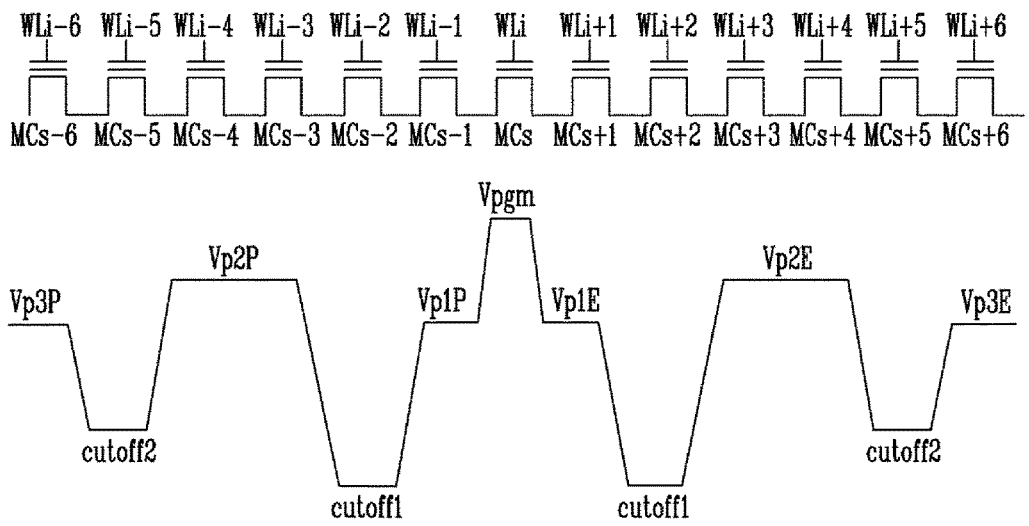
FIG. 9A is a diagram illustrating voltages applied to the memory cell transistors during the program voltage application period of a programming method according to an embodiment of the present disclosure.

FIG. 9A is a diagram illustrating voltages applied to the memory cell transistors during the program voltage application period of a programming method according to an embodiment of the present disclosure.

Examples of FIG. 9A is similar to the examples of FIG. 8A. The examples of FIG. 9A is different from the examples of FIG. 8A in that a first cutoff voltage cutoff1 is applied to the $(i-2)^{th}$ and $(i+2)^{th}$ word lines WLi−2 and WLi+2 and a second cutoff voltage cutoff2 is applied to the $(i-5)^{th}$ and $(i+5)^{th}$ word lines WLi−5 and WLi+5, and third pass voltages Vp3P and Vp3E are applied to the $(i-6)^{th}$ and $(i+6)^{th}$ word lines WLi−6 and WLi+6, respectively. Although not shown in FIG. 9, the third pass voltages Vp3P and Vp3E are also applied to the first to $(i-7)^{th}$ word lines WL1 to WLi−7 and the $(i+7)^{th}$ to $n^{th}$ word lines WLi+7 to WLn, respectively. According to an embodiment, the third pass voltages Vp3P and Vp3E may have a smaller value than the second pass voltages Vp2P and Vp2E and the first pass voltages Vp1P and Vp1E. In FIG. 9A, it is illustrated that the first cutoff voltage cutoff1 is greater than the second cutoff voltage cutoff2. However, according to an embodiment, the first cutoff voltage cutoff1 and the second cutoff voltage cutoff2 may have the same value. Alternatively, the second cutoff voltage cutoff2 may be greater than the first cutoff voltage cutoff1. In FIG. 9A, the second cutoff voltage cutoff2 is applied to the $(i-5)^{th}$ and $(i+5)^{th}$ word lines WLi−5 and WLi+5 to prevent charge sharing with the local boosting region.

The memory cells included in the memory cell string may be grouped as follows. For example, the memory cells MCs−1 to MCs+1 may be grouped as a first memory cell group, the memory cells MCs−2 and MCs+2 may be grouped as a second memory cell group, the memory cells MCs−4, MCs−3, MCs+3, and MCs+4 may be grouped as a third memory group, the memory cells MCs−5 and MCs+5 may be grouped as a fourth memory cell group, and the other memory cells MCs1 to MCs−6 and MCs+6 to MCn may be grouped as a fifth memory cell group. In this case, during the pass voltage application period, the first pass voltages Vp1P and Vp1E may be applied to the first memory cell group, the first cutoff voltage cutoff1 may be applied to the second memory cell group, and the second pass voltages Vp2P and Vp2E may be applied to the third memory cell group. Also, the second cutoff voltage cutoff2 may be applied to the fourth memory cell group, and the third pass voltages Vp3P and Vp3E may be applied to the fifth memory cell group. The second memory cell group is located adjacent to the first memory cell group, the third memory cell group is located adjacent to the second memory cell group, the fourth memory cell group is located adjacent to the third memory cell group, and the fifth memory cell group is located adjacent to the fourth memory cell group. The number of memory cells included in each group may be modified when necessary. For example, the number of memory cells belonging to the first memory cell group, the number of memory cells belonging to the second memory cell group, the number of memory cells belonging to the third memory cell group, the number of memory cells belonging to the fourth memory cell group, and the number of memory cells belonging to the fifth memory cell group are 3, 2, 4, 2, and n−11, respectively. However, the numbers may vary.

Figure 9B:
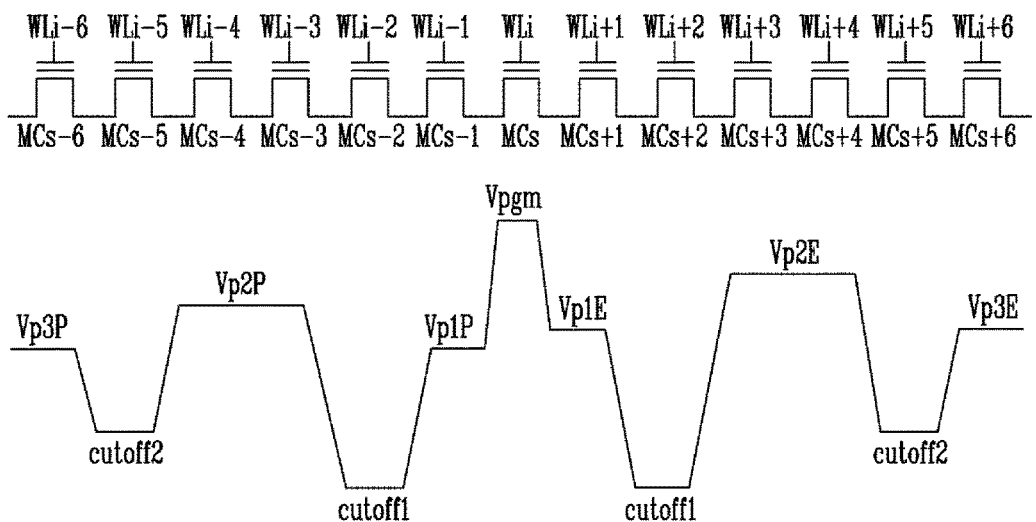
FIG. 9B is a diagram illustrating voltages applied to the memory cell transistors during the program voltage application period by a programming method according to an embodiment of the present disclosure.

FIG. 9B is a diagram illustrating voltages applied to the memory cell transistors during the program voltage application period of a programming method according to an embodiment of the present disclosure. Like FIG. 9A, in FIG. 9B, pass and program voltages applied to the word lines WLi−6 to WLi+6 of the 13 memory cells MCs−6 to MCs+6 including the memory cell MCs to be programmed are illustrated. FIG. 9B is different from FIG. 9A in that the first pass voltage Vp1E applied to the erase-state memory cells is greater than the first pass voltage Vp1P applied to the program-completed memory cells, the second pass voltage Vp2E applied to the erase-state memory cells is greater than the second pass voltage Vp2P applied to the program-completed memory cells, and the third pass voltage Vp3E applied to the erase-state memory cells is greater than the third pass voltage Vp3P applied to the program-completed memory cells. According to the above-described embodiment, the program/pass disturbance phenomenon can be prevented.

Figure 10:
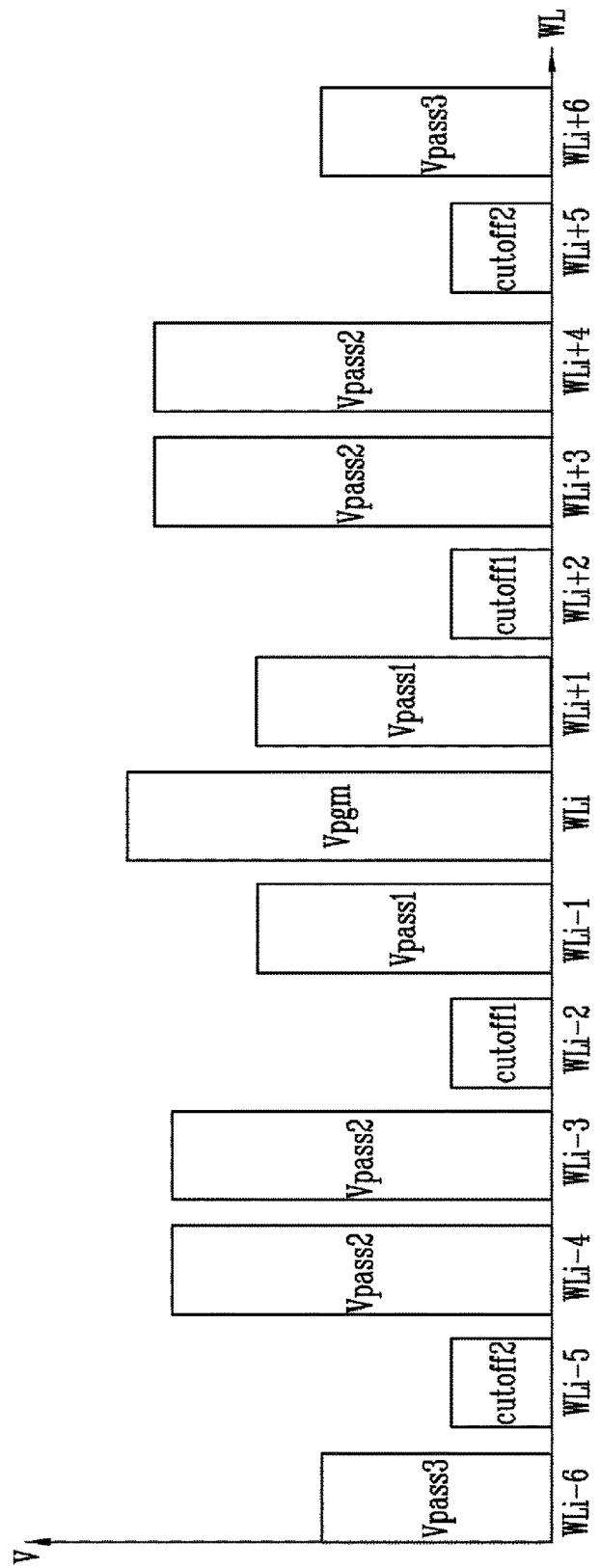
FIG. 10 is a diagram illustrating voltages applied to the memory cell transistors during the program voltage application period of a programming method according to an embodiment of the present disclosure.

FIG. 10 is a diagram illustrating voltages applied to the memory cell transistors during the program voltage application period of a programming method according to an embodiment of the present disclosure. FIG. 10 illustrates a voltage applied to each word line during the program voltage application period according to the examples of FIG. 9A. In FIG. 10, during the program voltage application period, the program voltage Vpgm is applied to the ith word line WLi, and a first pass voltage Vpass1 is applied to the $(i-1)^{th}$ and $(i+1)^{th}$ word lines WLi−1 and WLi+1. Also, the first cutoff voltage cutoff1 is applied to the $(i-2)^{th}$ and $(i+2)^{th}$ word lines WLi−2 and WLi+2. A second pass voltage Vpass2 is applied to the $(i-4)^{th}$ and $(i-3)^{th}$ word lines WLi−4 and WLi−3 and the $(i+3)^{th}$ and $(i+4)^{th}$ word lines WLi+3 and WLi+4. Also, the second cutoff voltage cutoff2 is applied to the $(i-5)^{th}$ and $(i+5)^{th}$ word lines WLi−5 and WLi+5, and a third pass voltage Vpass3 is applied to the $(i-6)^{th}$ and $(i+6)^{th}$ word lines WLi−6 and WLi+6. Although not shown in FIG. 10, the third pass voltage Vpass3 may also be applied to the first to (i−7)$^{th}$ word lines (e.g., WL1 to WLi−7) and the (i+7)$^{th}$ to n$^{th}$ word lines (e.g., WLi+7 to WLn). According to an embodiment, the second pass voltage Vpass2 may be greater than the first pass voltage Vpass1. Also, the third pass voltage Vpass3 may be smaller than the first pass voltage Vpass1.

Figure 11:
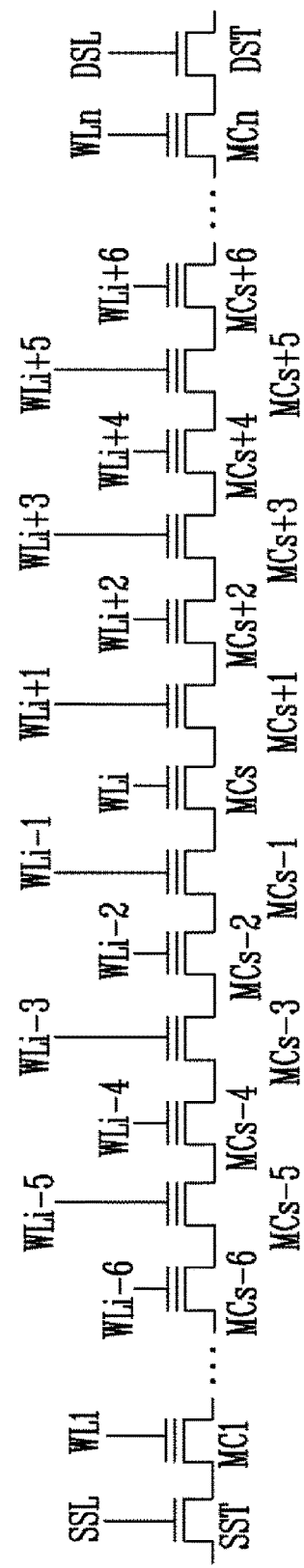
FIG. 11 is a diagram illustrating a memory cell string of a semiconductor memory device to which a programming method is applied according to an embodiment of the present disclosure.

FIG. 11 is a diagram illustrating a memory cell string of a semiconductor memory device to which a programming method is applied according to an embodiment of the present disclosure. The memory cell string includes a source select transistor SST, a drain select transistor DST, and a plurality of memory cells MC1, . . . , MCn. A source select line SSL is coupled to a gate electrode of the source select transistor SST. A drain select line DSL is coupled to a gate electrode of the drain select transistor DST. The word lines WL1, . . . , WLn are coupled to the plurality of memory cells MC1, . . . , MCn, respectively. In FIG. 11, a program target cell MCs, which is selected to be programmed, is coupled to an i$^{th}$ word line WLi. Also, memory cells MCs−1 and MCs+1 located adjacent to the program target cell MCs are coupled to (i−1)$^{th}$ and (i+1)$^{th}$ word lines WLi−1 and WL+1, respectively.

Figure 12:
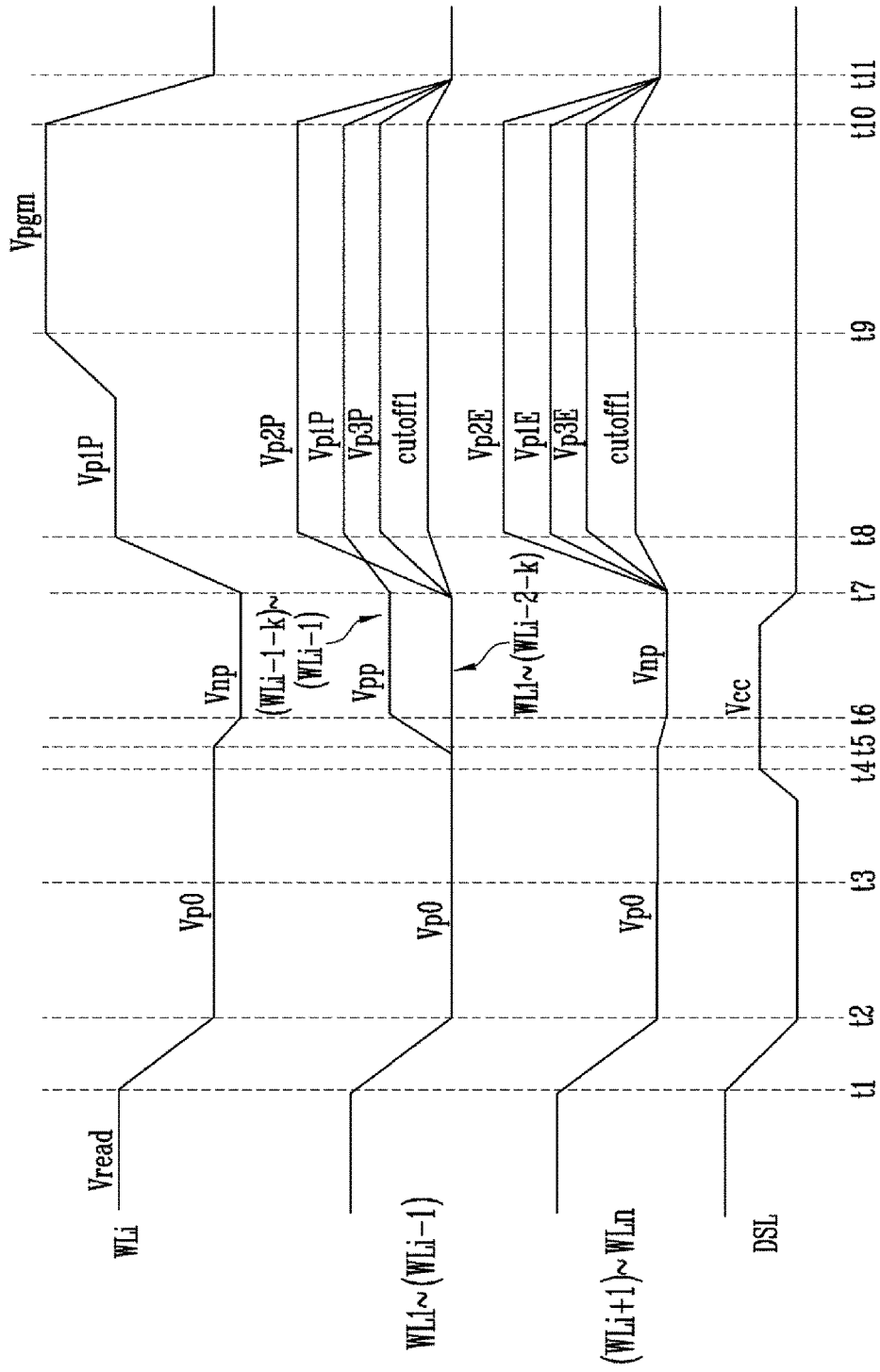
FIG. 12 is a graph illustrating a programming method according to an embodiment of the present disclosure.

FIG. 12 is a graph illustrating a programming method according to an embodiment of the present disclosure. Referring to FIG. 12, a period before a first point in time t1 may be a read period. During a standby period t2 to t5, a standby voltage Vp0 may be applied to each of the word lines WL1 to WLn. In FIG. 12, a program period t6 to t11 may include a pre-bias application period t6 to t7, a pass voltage application period t8 to t9, and a program voltage application period t9 to t10. As described above, the pre-bias application period t6 to t7 may be defined as a first program period, the pass voltage application period t8 to t9 may be defined as a second program period, and the program voltage application period t9 to t10 may be defined as a third program period. Here, other transition periods t5 to t6 and t7 to t8 may be between the periods.

FIG. 12 also illustrates a voltage applied to the drain select line DSL. Hereinafter, a voltage applied to each of the word lines WL1 to WLn during the program period when a program target cell MCs selected between the memory cells MC1 to MCn in the memory cell string is programmed will be described with reference to FIGS. 11 and 12.

A read operation may be performed before the first point in time t1, and therefore a read voltage Vread may be applied. During the standby period t2 to t5, the standby voltage Vp0 may be applied to all of the word lines.

During the pre-bias application period t6 to t7, a second pre-bias voltage Vnp having a negative value may be applied to the i$^{th}$ word line WLi. As described with reference to FIG. 4A, the second pre-bias voltage Vnp having the negative value may also be applied to the (i+1)$^{th}$ to n$^{th}$ word lines WLi+1 to WLn. A first pre-bias voltage Vpp having a positive value may be applied to the (i−1−k)$^{th}$ to (i−1)$^{th}$ word lines WLi−1−k to WLi−1. That is, the voltage applied to the (i−1−k)$^{th}$ to (i−1)$^{th}$ word lines WLi−1−k to WLi−1 is increased to the first pre-bias voltage Vpp from the standby voltage Vp0 that was applied during the standby period. The standby voltage Vp0 that was applied during the standby period may be applied to the first to (i−2−k)$^{th}$ word lines WL1 to WLi−2−k.

During the pass voltage application period t8 to t9, a corresponding pass voltage or cutoff voltage may be applied to each of the first to nth word lines WL1 to WLn. In an embodiment, the pass and cutoff voltages described with reference to FIG. 9A may be applied to the word lines WL1 to WLn during the pass voltage application period t8 to t9.

Referring to FIGS. 9 and 12, during the pass voltage application period t8 to t9, the first pass voltage Vp1P is applied to the i$^{th}$ word line WLi. Also, the first pass voltages Vp1P and Vp1E may be applied to the (i−1)$^{th}$ and (i+1)$^{th}$ word lines WLi−1 and WLi+1, respectively. The first pass voltages Vp1P and Vp1E may have the same value. In an embodiment, as described with reference to FIG. 9B, the first pass voltage Vp1E may have a value greater than the first pass voltage Vp1P. The first cutoff voltage cutoff1 may be applied to the (i−2)$^{th}$ and (i+2)$^{th}$ word lines WLi−2 and WLi+2. The second pass voltages Vp2P and Vp2E may be applied to the (i−3)$^{th}$, (i−4)$^{th}$, (i+3)$^{th}$, and (i+4)$^{th}$ word lines WLi−3, WLi−4, WLi+3, and WLi+4. The first cutoff voltage cutoff1 may be applied to the (i−5)$^{th}$ and (i+5)$^{th}$ word lines WLi−5 and WLi+5. The third pass voltages Vp3P and Vp3E may be applied to first to (i−6)$^{th}$ word lines WL1 to WLi−6 and the (i+6)$^{th}$ to n$^{th}$ word lines WLi+6 to WLn. During the program voltage application period t9 to t10, the program voltage Vpgm may be applied to the i$^{th}$ word line WLi. During the program voltage application period t9 to t10, the voltage that was applied during the pass voltage application period t8 to t9 may be applied to the first to (i−1)$^{th}$ word lines WL1 to WLi−1 and the (i+1)$^{th}$ to n$^{th}$ word lines WLi+1 to WLn.

As described above, according to the embodiment, it is possible to prevent program disturbance of the semiconductor memory device.

Figure 13:
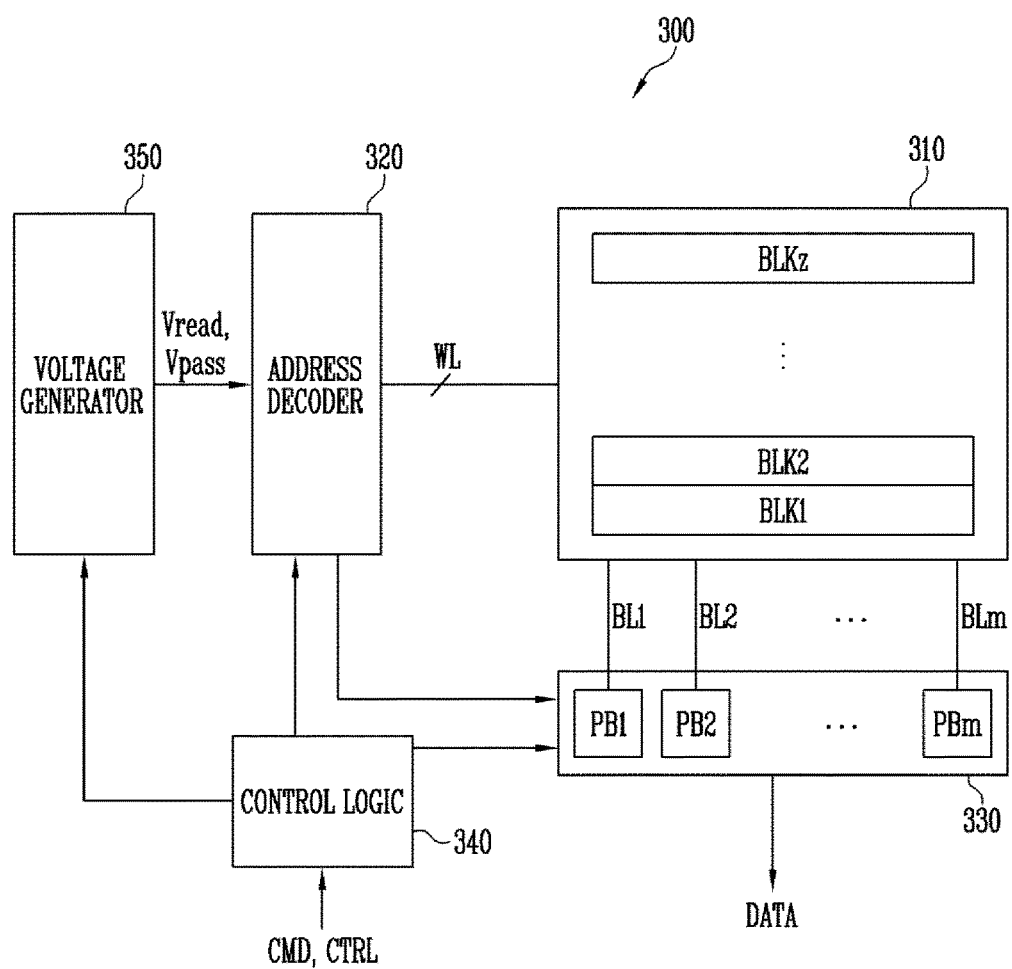
FIG. 13 is a diagram illustrating a semiconductor memory device to which a programming method is applicable according to an embodiment of the present disclosure.

FIG. 13 is a diagram illustrating a semiconductor memory device to which a programming method is applicable according to an embodiment of the present disclosure.

Referring to FIG. 13, the semiconductor memory device 300 may include a memory cell array 310, an address decoder 320, a read/write circuit 320, a control logic 340, and a voltage generator 350.

The memory cell array 310 may include a plurality of memory blocks BLK1 to BLKz. The plurality of memory blocks BLK1 to BLKz are coupled to the address decoder 320 through word lines WL. The plurality of memory blocks BLK1 to BLKz are coupled to the read/write circuit 330 through bit lines BL1 to BLm. Each of the plurality of memory blocks BLK1 to BLKz includes a plurality of memory cells. In an embodiment, the plurality of memory cells may be nonvolatile memory cells. The plurality of memory cells may be configured as nonvolatile memory cells having a vertical channel structure.

The address decoder 320, the read/write circuit 330, and the control logic 340 operate as peripheral circuits for driving the memory cell array 310.

The address decoder 320 is coupled to the memory cell array 310 through the word lines WL. The address decoder 320 may operate in response to control signals of the control logic 340. The address decoder 320 receives an address through an input/output buffer (not illustrated) inside the semiconductor memory device 300.

The address decoder 320 may decode the address signal to obtain a block address. The address decoder 320 selects at least one memory block according to the block address. Also, during a read operation, the address decoder 320 applies a read voltage Vread generated by the voltage generator 350 to a selected word line in a selected memory block and applies a pass voltage Vpass to unselected word lines. Also, during a program verify operation, the address decoder 320 applies a verify voltage generated by the voltage generator 350 to a selected word line in a selected memory block and applies the pass voltage Vpass to unselected word lines.

The address decoder 320 may decode the address to obtain a column address. The address decoder 320 provides the column address to the read/write circuit 330.

Read and program operations of the semiconductor memory device 300 are performed on a page basis. The address received in response to a request of the read and program operations may include a block address, a row address, and a column address. The address decoder 320 selects one memory block and one word line according to the block address and the row address. The column address is decoded by the address decoder 320 to be provided to the read/write circuit 330.

The address decoder 320 may include a block decoder, a row decoder, a column decoder, and an address buffer.

The read/write circuit 330 may include a plurality of page buffers PB1 to PBm. The plurality of page buffers PB1 to PBm are coupled to the memory cell array 310 through the bit lines BL1 to BLm. In order to detect a threshold voltage of the memory cells in the read operation and the program verify operation, the plurality of page buffers PB1 to PBm may sense, through sensing nodes, changes in the amount of current varying depending on program states of corresponding memory cells while continuously supplying a sensing current to the bit lines coupled to the memory cells, thereby latching the sensed change as sensing data. The plurality of page buffers PB1 to PBm may adjust, based on a temperature, precharge potential levels of the sensing nodes respectively included therein. For example, when the read operation and the program verify operation are performed, the precharge potential level of the sensing node is increased when the semiconductor memory device has a relatively high temperature, and the precharge potential level of the sensing node is decreased when the semiconductor memory device has a relatively low temperature.

The read/write circuit 330 operates in response to page buffer control signals output from the control logic 340.

The read/write circuit 330 temporarily stores read data by detecting data bits of the memory cells in the read operation and then outputs data DATA to the input/output buffer (not illustrated) of the semiconductor memory device 300.

In an embodiment, the read/write circuit 330 may include page buffers (or page registers), a column selection circuit, and the like.

The control logic 340 is coupled to the address decoder 320, the read/write circuit 330, and the voltage generator 350. The control logic 340 receives a command CMD and a control signal CTRL through the input/output circuit (not illustrated) of the semiconductor memory device 300. The control logic 340 may control the general operations of the semiconductor memory device 300 in response to the control signal CTRL. Also, the control logic 340 outputs a control signal for adjusting the precharge potential levels of the sensing nodes of the plurality of page buffers PB1 to PBm.

In the read operation, the voltage generator 350 generates the read voltage Vread and the pass voltage Vpass in response to a voltage generator control signal output from the control logic 340.

Figure 14:
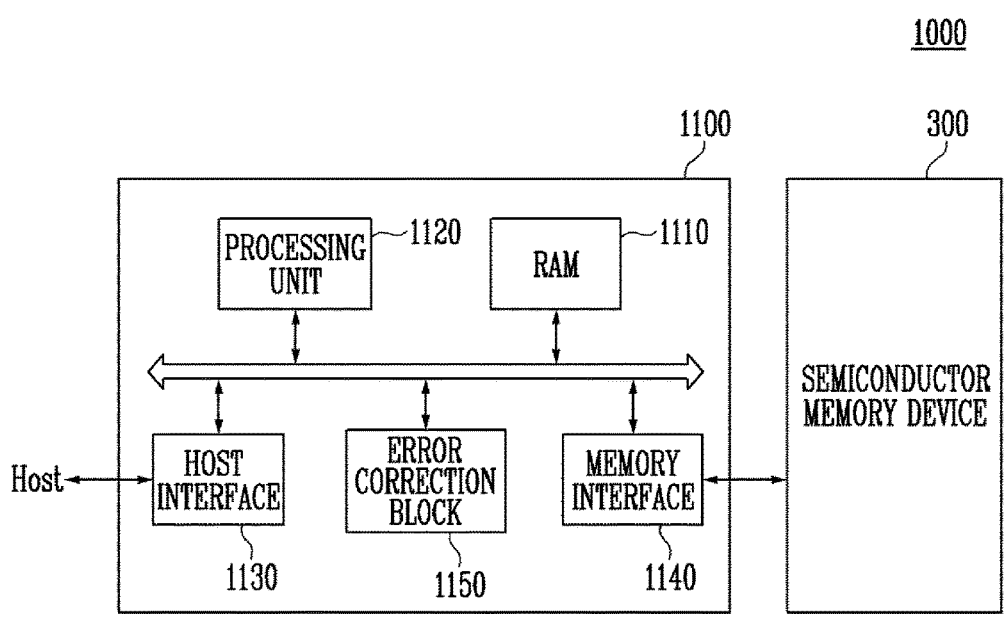
FIG. 14 is a diagram illustrating a memory system including the semiconductor memory device of FIG. 13.

FIG. 14 is a diagram illustrating a memory system including the semiconductor memory device of FIG. 13.

Referring to FIG. 14, the memory system 1000 may include a semiconductor memory device 300 and a controller 1100.

The semiconductor memory device 300 may include the semiconductor memory device described with reference to FIG. 1. Hereinafter, any repetitive detailed description will be omitted or simplified.

The controller 1100 is coupled to a host Host and the semiconductor memory device 300. The controller 1100 may access the semiconductor memory device 300 in response to a request from the host Host. For example, the controller 1100 may control read, write, erase, and background operations of the semiconductor memory device 300. The controller 1100 may provide an interface between the semiconductor memory device 300 and the host Host. The controller 1100 may drive firmware for controlling the semiconductor memory device 300.

The controller 1100 may include a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 300 and the host Host, and a buffer memory between the semiconductor memory device 300 and the host Host. The processing unit 1120 controls the general operations of the controller 1100. Also, the controller 1100 may temporarily store program data provided from the host Host in a write operation.

The host interface 1130 may include a protocol for exchanging data between the host Host and the controller 1100. In an embodiment, the controller 1100 may communicate with the host Host through an interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 300. For example, the memory interface 1140 may include a NAND interface or a NOR interface.

The error correction block 1150 may detect and correct an error in data received from the semiconductor memory device 300 by using an error correction code (ECC). The processing unit 1120 may control the semiconductor memory device 300 to adjust a read voltage, based on an error detection result of the error correction block 1150, and to perform re-reading. In an embodiment, the error correction block 1150 may be provided as a component of the controller 1100.

The controller 1100 and the semiconductor memory device 300 may be integrated into one semiconductor device. In an embodiment, the controller 1100 and the semiconductor memory device 300 may constitute a memory card such as a personal computer memory card international association (PCMCIA), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 300 may constitute a semiconductor drive such as a solid state drive (SSD). The SSD may store data in a semiconductor memory. If the memory system 1000 is used as the semiconductor drive SSD, the operating speed of the host Host coupled to the memory system 1000 can be improved.

In an example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory device 300 or the memory system 1000 may be packaged in various forms. For example, the semiconductor memory device 300 or the memory system 1000 may be packaged in a package such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi chip package (MCP), wafer-level fabricated package (WFP), or wafer-level processed stack package (WSP).

Figure 15:
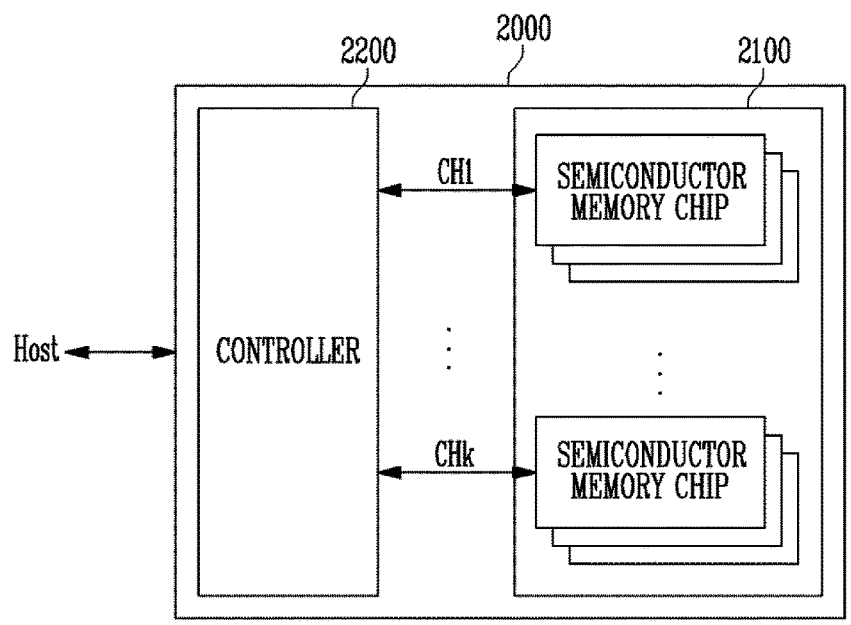
FIG. 15 is a diagram illustrating an application example of the memory system of FIG. 14.

FIG. 15 is a diagram illustrating an application example of the memory system of FIG. 14.

Referring to FIG. 15, the memory system 2000 may include a semiconductor memory device 2100 and a controller 2200. The semiconductor memory device 2100 may include a plurality of semiconductor memory chips. The plurality of semiconductor memory chips are divided into a plurality of groups.

FIG. 15 illustrates the plurality of groups communicating with the controller 2200 through first to k$^{th}$ channels CH1 to CHk. Each semiconductor memory chip may be configured and operated identically to the semiconductor memory device 300 described with reference to FIG. 1.

Each group may communicate with the controller 2200 through one common channel. The controller 2200 is configured similarly to the controller 1100 described with reference to FIG. 14. The controller 2200 may control the plurality of memory chips of the semiconductor memory device 2100 through the plurality of channels CH1 to CHk.

Figure 16:
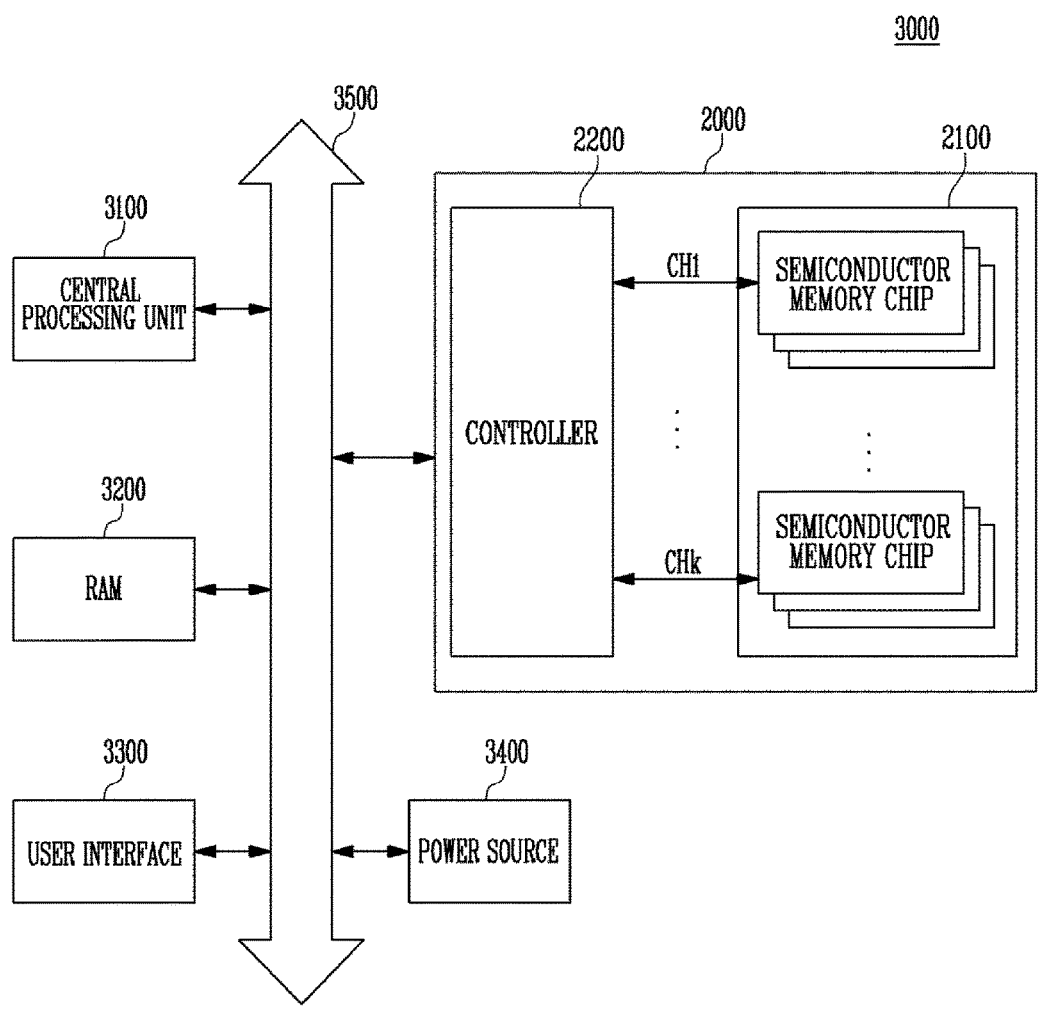
FIG. 16 is a diagram illustrating a computing system including the memory system described with reference to FIG. 15.

FIG. 16 is a diagram illustrating a computing system including the memory system described with reference to FIG. 15.

Referring to FIG. 16, the computing system 300 may include a central processing unit 3100, a RAM 3200, a user interface 3300, a power source 3400, a system bus 3500, and a memory system 2000.

The memory system 2000 is electrically coupled to the central processing unit 3100, the RAM 3200, the user interface 3300, and the power source 3400 through the system bus 3500. Data provided through user interface 3300 or data processed by the central processing unit 3100 may be stored in the memory system 2000.

FIG. 16 the semiconductor memory device 2100 coupled to the system bus 3500 through the controller 2200. However, the semiconductor memory device 2100 may be directly connected to the system bus 3500. In this case, the function of the controller 2200 may be performed by the central processing unit 3100 and the RAM 3200.

In FIG. 16, it is illustrated that the memory system 2000 described with reference to FIG. 15 is provided. However, the memory system 2000 may be replaced by the memory system 1000 described with reference to FIG. 14. In an embodiment, the computing system 3000 may include both the memory systems 1000 and 2000 described with reference to FIGS. 14 and 15.

According to embodiments of the present disclosure, it is possible to provide a method for programming a semiconductor memory device capable of preventing program disturbance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
   a memory cell array including a plurality of memory strings;
   an address decoder coupled to the memory cell array through word lines, the address decoder being configured to apply operation voltages to operate the memory cell array; and
   a control logic configured to control the address decoder, wherein the control logic is configured to:
   control the address decoder to apply a standby voltage to word lines coupled to a plurality of memory cells included in a selected memory cell string during a standby period; and
   control the address decoder to apply a first pre-bias voltage to a word line coupled to at least one of programmed memory cells of the selected memory cell string, and to apply a second pre-bias voltage to a word line coupled to a program target cell of the selected memory cell string, during a first program period, and
   wherein the first pre-bias voltage is greater than the standby voltage, and the second pre-bias voltage is smaller than the standby voltage.

2. The semiconductor memory device of claim 1, wherein the first pre-bias voltage has a positive voltage value.

3. The semiconductor memory device of claim 1, wherein the second pre-bias voltage has a negative voltage value.

4. The semiconductor memory device of claim 1, wherein the control logic is further configured to control the address decoder to apply the second pre-bias voltage to word lines connected to erase-state memory cells of the selected memory cell string during the first program period.

5. The semiconductor memory device of claim 1, wherein the control logic is further configured to control the address decoder to apply the standby voltage to word lines connected to the other memory cells except the memory cell receiving the first pre-bias voltage, among the programmed memory cells of the selected memory cell string during the first program period.

6. The semiconductor memory device of claim 1, wherein the control logic is further configured to:
control the address decoder, during a second program period, to apply a pass voltage or a cutoff voltage to the word lines connected to the memory cells included in the selected memory cell string; and
control the address decoder, during a third program period, to apply a program voltage to the word line connected to the program target cell.

7. The semiconductor memory device of claim 6, wherein, during the third program period, the voltage applied to the word lines connected to the memory cells except the program target cell among the memory cells included in the selected memory cell string is maintained at the voltage applied during the second program period.

8. The semiconductor memory device of claim 1, wherein:
the selected memory cell string includes first to nth memory cells, wherein n is a natural number greater than 1;
the program target cell is an ith memory cell among the first to nth memory cells, wherein i is a natural number that is greater than 1 and smaller than n; and
during the first program period, the first pre-bias voltage is applied to word lines connected to (i−1−k)th to (i−1)th memory cells, and the second pre-bias voltage is applied to word lines connected to ith to (i+1+j)th memory cells, wherein k is an integer that is greater than or equal to 0 and smaller than or equal to i−2, and j is an integer that is greater than or equal to 0 and smaller than or equal to n−1−i.

9. The semiconductor memory device of claim 1, wherein the standby voltage is a ground voltage.

10. A semiconductor memory device comprising:
a memory cell array including a plurality of memory strings;
an address decoder coupled to the memory cell array through word lines, the address decoder being configured to apply operation voltages to operate the memory cell array; and
a control logic configured to control the address decoder, wherein the control logic is configured to:
control the address decoder to precharge a channel region of a selected memory cell string;
control the address decoder to apply a pass voltage to word lines coupled to memory cells included in the selected memory cell string; and
control the address decoder to apply a program voltage to a word line coupled to a program target cell of the selected memory cell string,
wherein, during controlling the address decoder to apply the pass voltage to the word lines coupled to the memory cells included in the selected memory cell string, a first pass voltage is applied to word lines coupled to the program target cell and a first memory cell group located adjacent to the program target cell, a first cutoff voltage is applied to word lines coupled to a second memory cell group located adjacent to the first memory cell group, and a second pass voltage is applied to word lines coupled to a third memory cell group located adjacent to the second memory cell group.

11. The semiconductor memory device of claim 10, wherein:
the selected memory cell string includes first to nth memory cells, wherein n is a natural number greater than one (1);
the program target cell is an ith memory cell among the first to nth memory cells, wherein i is a natural number that is greater than 1 and smaller than n;
the first memory cell group includes (i−1)th to (i+1)th memory cells;
the second memory cell group includes (i−2)th and (i+2)th memory cells; and
the third memory cell group includes (i−3)th and (i+3)th memory cells.

12. The semiconductor memory device of claim 11, wherein, during controlling the address decoder to apply the pass voltage to the word lines coupled to the memory cells included in the selected memory cell string, a second cutoff voltage is applied to word lines coupled to a fourth memory cell group located adjacent to the third memory cell group, and a third pass voltage is applied to word lines coupled to a fifth memory cell group located adjacent to the fourth memory cell group.

13. The semiconductor memory device of claim 12, wherein:
the third memory cell group further includes (i−4)th and (i+4)th memory cells;
the fourth memory cell group includes (i−5)th and (i+5)th memory cells; and
the fifth memory cell group includes (i−6)th and (i+6)th memory cells.

14. The semiconductor memory device of claim 13, wherein the fifth memory cell group further includes first to (i−7)th memory cells and (i+7)th to nth memory cells.

15. The semiconductor memory device of claim 10, wherein the second pass voltage is smaller than the first pass voltage.

16. The semiconductor memory device of claim 10, wherein the second pass voltage is greater than the first pass voltage.

17. The semiconductor memory device of claim 12, wherein the third pass voltage is smaller than the second pass voltage.

18. The semiconductor memory device of claim 12, wherein each of the first cutoff voltage and the second cutoff voltage is a ground voltage.

19. The semiconductor memory device of claim 10, wherein, during controlling the address decoder to apply the program voltage to the word line coupled to the program target cell of the selected memory cell string, the voltage applied to the word lines coupled to the first to (i−1)th memory cells and the (i+1)th to nth memory cells is maintained at the voltage applied during a period of applying the pass voltage to the word lines coupled to the memory cells included in the selected memory cell string.

* * * * *